(12) United States Patent
Takeuchi et al.

(10) Patent No.: US 10,361,685 B2
(45) Date of Patent: Jul. 23, 2019

(54) SEMICONDUCTOR DEVICE

(71) Applicant: Renesas Electronics Corporation, Tokyo (JP)

(72) Inventors: Kan Takeuchi, Tokyo (JP); Masaki Shimada, Tokyo (JP); Takeshi Okagaki, Tokyo (JP); Yoshio Takazawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 211 days.

(21) Appl. No.: 15/367,019

(22) Filed: Dec. 1, 2016

(65) Prior Publication Data
US 2017/0187358 A1 Jun. 29, 2017

(30) Foreign Application Priority Data

Dec. 25, 2015 (JP) ................. 2015-253805

(51) Int. Cl.
*H03K 3/03* (2006.01)
*G01R 31/28* (2006.01)
*H03K 3/011* (2006.01)
*H03K 5/159* (2006.01)
*G01R 31/317* (2006.01)

(52) U.S. Cl.
CPC ....... *H03K 3/0315* (2013.01); *G01R 31/2856* (2013.01); *G01R 31/31725* (2013.01); *H03K 3/011* (2013.01); *H03K 5/159* (2013.01)

(58) Field of Classification Search
CPC ......... H03L 7/099; H03L 7/0995; H03L 7/10; H03L 7/18; H03L 2207/06; H03L 7/093; H03B 5/06; H03B 5/1212; H03B 5/1234; H03B 5/24; H03K 5/1252; H03K 3/0322; H03K 3/0315; H03K 3/354; H03K 3/159; H03K 3/011; G01R 31/2856; G01R 31/31725
USPC ............ 331/16, 57, 176, 74; 324/617; 326/8
See application file for complete search history.

(56) References Cited

U.S. PATENT DOCUMENTS

| 6,556,088 B1 * | 4/2003 | Dietl ....................... H02M 3/07 331/17 |
| 6,724,214 B2 | 4/2004 | Manna et al. |
| 7,315,221 B2 * | 1/2008 | Ha ......................... G11C 11/406 331/176 |
| 7,629,856 B2 * | 12/2009 | Thaller ............... H03F 3/45237 327/158 |
| 2010/0171558 A1 * | 7/2010 | Kim ..................... H03K 3/0322 331/57 |

FOREIGN PATENT DOCUMENTS

| JP | 2004-266243 A | 9/2004 |
| JP | 2011-227756 A | 11/2011 |

* cited by examiner

*Primary Examiner* — Arnold M Kinkead
(74) *Attorney, Agent, or Firm* — McGinn I. P. Law Group, PLLC.

(57) ABSTRACT

There is to provide a semiconductor device capable of predicting a wear-out failure based on the degradation stress cumulative amount of power supply voltage and environmental temperature imposed on the device, which includes a ring oscillator having a plurality of stages of inverters, and a control circuit that emphasizes the voltage dependency and temperature dependency of an oscillation frequency of the ring oscillator or a control circuit that emphasizes the temperature dependency not the voltage dependency.

20 Claims, 26 Drawing Sheets

SEMICONDUCTOR DEVICE

CROSS-REFERENCE TO RELATED APPLICATIONS

The disclosure of Japanese Patent Application No. 2015-253805 filed on Dec. 25, 2015 including the specification, drawings and abstract is incorporated herein by reference in its entirety.

BACKGROUND

This disclosure relates to a semiconductor device and is applicable to a semiconductor device, for example, having a degradation stress detection function.

Japanese Unexamined Patent Application Publication No. 2004-266243 describes: "The first test structure is, to monitor the hot carrier degradation. The circuit is formed by two ring oscillators: one receives the hot carrier effect (degradation ring oscillator) in the transistor, and the other is not subject to the hot carrier effect (non-degradation ring oscillator). At first, each of the both ring oscillators has a predetermined frequency. The both frequencies do not have to be identical. Degradation ring oscillator is applied to an input of a binary counter. Non-degradation ring oscillator frequency is divided into lower frequency. The divided frequency is, in one state, to gate the binary counter on and, in another state, to reset the counter. Just after the fabrication, the binary counter detects a finite count number "i" during each gate cycle. When the degradation ring oscillator frequency is reduced due to the hot carrier effect, the binary counter detects a decrease of pulse applied at some point, and as the result, the count becomes "j" (j<i). A designer determines a degradation difference (i−j) that matters from the viewpoint of reliability; when the (i−j) exceeds a predetermined limit, the circuit is then to create an end of life signal."

Japanese Unexamined Patent Application Publication No. 2011-227756 describes: "A terminal device is provided with a high temperature detection counter circuit that detects a temperature of the device, integrates the stress accelerating time weighted according to the detected temperature as a stress count value, and outputs an interrupt signal when the stress count value gets a predetermined value and more, and a CPU of controlling the operation of the device. When the total value of a cumulative stress accelerating time obtained by cumulatively counting the interrupt signal from the high temperature detection counter circuit and a system time from a timer circuit exceed a set stress management time, the CPU performs rewriting into a non-volatile memory."

SUMMARY

An object of this disclosure is to provide a semiconductor device capable of predicting wear-out failure based on the cumulative degradation stress amount caused by the power supply potential and the environmental temperature imposed on the semiconductor device.

Other objects and novel features will be apparent from the description of the specification and the attached drawings.

The outline of the typical one of the disclosure will be briefly described as follows.

Specifically, a semiconductor device includes a ring oscillator having a plurality of stages of inverters, and a control circuit that emphasizes the voltage dependency and the temperature dependency of the oscillation frequency of the ring oscillator or a control circuit that emphasizes the temperature dependency not the voltage dependency.

According to the semiconductor device, it is possible to predict wear-out failure based on the cumulative degradation stress amount.

DETAILED DESCRIPTION

Figure 1:
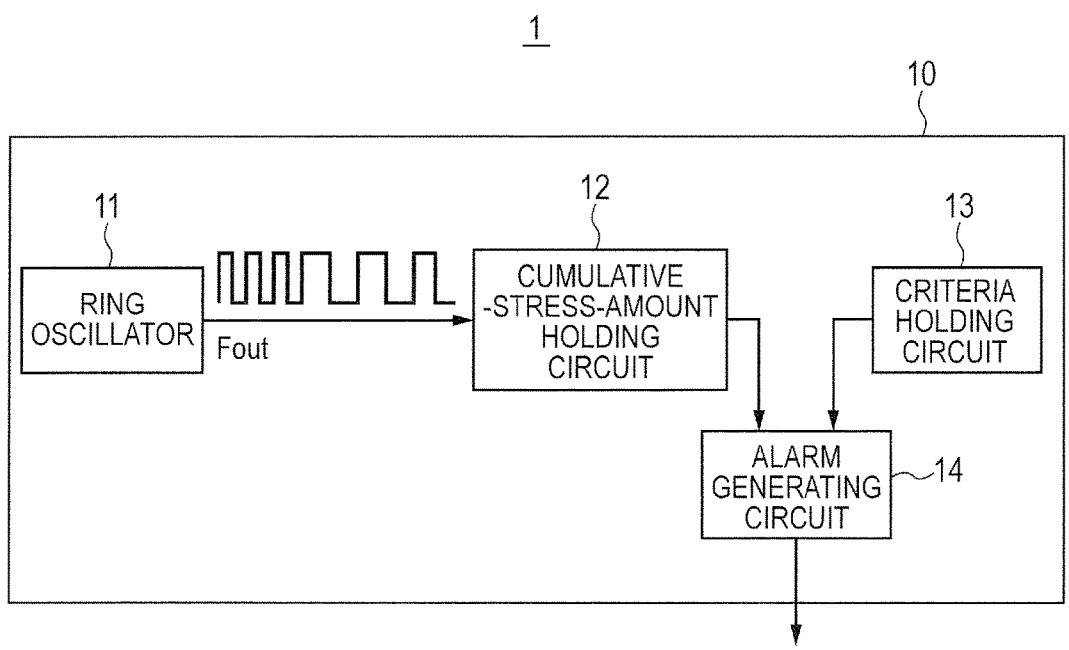
FIG. 1 is a view for use in describing a semiconductor device according to one embodiment.

When a semiconductor device is used for long duration, it comes to wear-out failure. When it is subject to degradation stress continuously during the use and the cumulative amount reaches to a predetermined value, a fault occurs with a predetermined probability. The lifetime until the fault depends on the power supply potential and the environmental temperature. The inventor et al. have examined not the direct capture of the wear-out failure phenomenon but the prediction of the wear-out failure according to the degradation stress cumulative amount due to the power supply potential and the environmental temperature imposed on the semiconductor device.

As described in a reference document, in the wear-out failure factor such as Time-Dependent Dielectric Breakdown of a gate oxide of a device (hereinafter, referred to as a gate-TDDB) and Negative Bias Temperature Instability (hereinafter, referred to as NBTI), the lifetime depends on, for example, the $-n^{th}$ power ($V^{\wedge}(-n)$) of a voltage (power-law model), or the inverse of the exponent ($\exp(-BBV)$) (V model), and at the same time, depends on the exponential of the inverse of a temperature ($\exp(Ea/kT)$). In the wear-out failure factor such as electromigration and stress migration, the lifetime depends on the exponential of the inverse of a temperature ($\exp(Ea/kT)$), with a little voltage dependency. Here, the reference codes n, B, and Ea are the coefficients inherent to the wear-out failure factor and k is a Boltzmann constant. With reference to the following reference document, its contents are incorporated into the invention.

[Reference Document] "Failure Mechanisms and Models for Semiconductor Devices" JEDEC publication No. 122E, http://web.cecs.pdx.edu/~cgshirl/Documents/jep122E.pdf Stress amount can be represented by the inverse of the lifetime, as shown in the following expressions (1) and (2).

In the case of the gate-TDDB and NBTI:

$$1/\tau(T,V) \propto 1/(V^{\wedge}(-n) \times \exp(Ea/kT)) = V^{\wedge}n \times \exp(-Ea/kT) \quad (1)$$

Here, $\tau(T, V)$ is the function of a temperature (T) and a voltage (V) and the wear-out failure lifetime depending on T and V.

In the case of the electromigration and the stress migration:

$$1/\tau(T) \propto 1/(\exp(Ea/kT)) = \exp(-Ea/kT) \quad (2)$$

Here, $\tau(T)$ is the function of a temperature (T) and the wear-out failure lifetime depending on T.

When the stress amount per unit time at 125° C. is defined as 1 and the temperature dependency coefficient (Ea) is defined as, for example, 1 eV, the stress amount becomes about three times at 140° C. (lifetime is ⅓) and about 5.5 times at 150° C. (lifetime is 1/5.5). The stress amount is reduced at a temperature lower than 125° C.; for example, at 110° C., it is about 0.3 times (lifetime is 3.3 times), and at 100° C., about 0.15 times (lifetime is 6.7 times).

Thus, the temperature dependency of the stress amount is really large, and therefore, in the method of using a plurality of temperature sensors having different temperature thresholds disclosed in Japanese Unexamined Patent Application Publication No. 2011-227756, an error is too large or the number of necessary temperature sensors becomes enormous. The inventor et al. examined a method of making CPU convert the temperature information indicated by a temperature sensor into the stress amount according to the expressions (1) and (2); however, this would disturb the original task of the CPU because the periodic processing of the CPU is required.

Further, in order to reduce leakage power in a semiconductor device, power domain is divided into a plurality of power islands to cut off the power in an unused area. When the CPU is in a cut-off state of the power, the stress amount in another operating area cannot be measured.

Further, as another object, in the wear-out failure factor such as the gate-TDDB and the NBTI, both the temperature and the voltage are the factors that determine the stress amount together.

Hereinafter, embodiments, examples, comparison examples, and application examples will be described with reference to the drawings. In the following description, the same codes are attached to the same components and their repeated description is omitted. Here, for the sake of making the description clearer, the width, thickness, and shape of each unit are sometimes shown schematically, compared to the actual form; however, this is only one example and not to restrict the interpretation of the invention.

<Embodiment>

FIG. 1 is a view for use in describing a semiconductor device according to one embodiment. A semiconductor device 1 according to the embodiment includes a cumulative degradation stress detection circuit 10. The cumulative degradation stress detection circuit 10 includes a ring oscillator 11, a circuit for holding a cumulative degradation stress count value obtained from the output (cumulative-stress-amount holding circuit 12), and a circuit for holding a count value of criteria (judgment standard) (criteria holding circuit 13). The cumulative degradation stress detection circuit 10 further includes a circuit for generating a cumulative stress alarm (alarm generating circuit 14) by comparison between the cumulative degradation stress count value and the count value of the criteria. More specifically, the cumulative-stress-amount holding circuit 12 periodically obtains the p-th power of the oscillation frequency of the ring oscillator 11 and accumulates the above. Alternatively, the oscillation count is accumulated as it is. When the count value of the cumulative-stress-amount holding circuit 12 reaches to a predetermined value and more, the alarm generating circuit 14 issues an alarm. The semiconductor device 1 does not have to be formed by one semiconductor chip (semiconductor substrate). The ring oscillator 11 and the cumulative-stress-amount holding circuit 12 are preferably formed on one semiconductor chip.

Figure 2A:
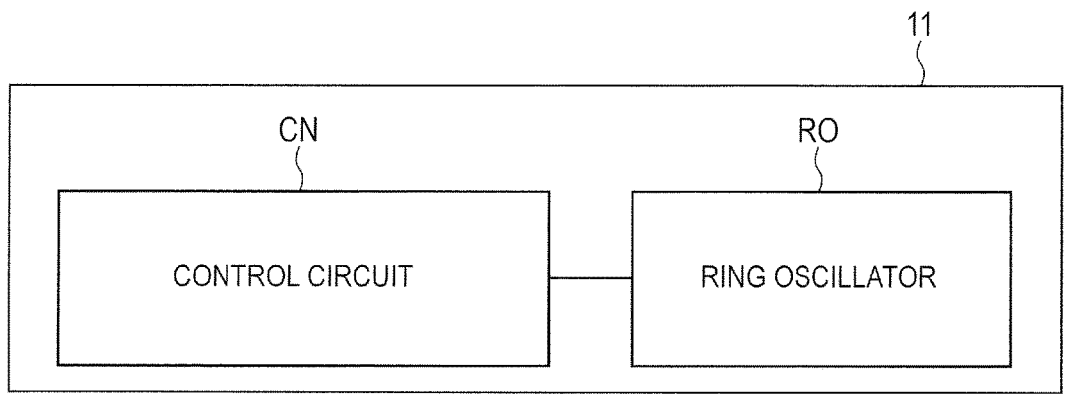
FIG. 2A is a block diagram for use in describing the structure of a ring oscillator in FIG. 1.

FIG. 2A is a block diagram for use in describing the ring oscillator in FIG. 1. The ring oscillator 11 is provided with a control circuit CN of emphasizing the V dependency and the T dependency or only the T dependency as for the ring oscillator RO. In the ring oscillator 11, a p-th power of the oscillation frequency is substantially in proportion to the inverse of the lifetime of the wear-out failure factor ($\tau(T, V)$, or $\tau(T)$). The oscillation frequency ($F(T, V)$) of the ring oscillator 11 is in proportion to a power of the voltage ($V^{m0}$) (or exponent $\exp(B0*V)$) and an exponential of the temperature inverse ($\exp(-Ea0/kT)$), and the p-th power thereof is substantially in proportion to the voltage and temperature dependency of the stress amount of the wear-out failure factor. Specifically, when the inverse of the lifetime of the wear-out failure factor is in proportion to a power of the voltage ($V^n$) and exponential of the inverse of temperature ($\exp(-Ea/kT)$), it can be expressed as $n \equiv m0*p$ and $Ea \equiv Ea0*p$. Therefore, $F(T, V)$ is the function of T and V and the following expression (3) is satisfied, largely depending on T and V.

$$\{F(T,V)\}^p \propto 1/\tau(T,V) \quad (3).$$

Alternatively, the oscillation frequency ($F(T)$) of the ring oscillator 11 is in proportion to the exponential of the temperature inverse ($\exp(-Ea/kT)$) and the p-th power is in proportion to the temperature dependency of the stress amount of the wear-out failure factor. As the result, $F(T)$ is the function of T and the following expression (4) is satisfied, largely depending on T.

$$\{F(T)\}^p \propto 1/\tau(T) \quad (4).$$

The ring oscillator 11 has the properties of the expression (3) or the expression (4).

According to the ring oscillator of the embodiment, the oscillation frequency is extremely correlated with the stress amount of the wear-out failure having a large voltage and temperature dependency; as the result, it is possible to know the cumulative stress amount in a semiconductor device with the ring oscillator of the embodiment mounted there, according to the oscillation frequency. Further, it can help optimize the stress environment of the semiconductor device and predict a fault, hence to obtain a reliable and secure system.

According to the embodiment, the wear-out failure caused by the TDDB and NBTI wear-out failure factor can be detected by using the ring oscillator having the properties of the expression (3), and the wear-out failure caused by the electromigration and stress migration wear-out failure factors can be detected by using the ring oscillator having the properties of the expression (4). Further, the cumulative degradation stress amount imposed on a semiconductor device can be measured in a simple calculation of the p-th power of the oscillation frequency of the ring oscillator. The calculation of the p-th power can be realized by a simple circuit without using the CPU. In this case, the symbol p is a natural number of single digit, preferably 4 and less. Alternatively, in the case of p=1, the output of the ring oscillator may be simply accumulated. Based on the cumulative degradation stress amount, it is possible to predict a wear-out failure in a semiconductor device and do the preparation for the fault in advance, hence to obtain a reliable and secure system.

EXAMPLE

<Cumulative Degradation Stress Detection Circuit>

A cumulative degradation stress detection circuit will be hereinafter described in every element.

(Ring Oscillator)

Figure 2B:
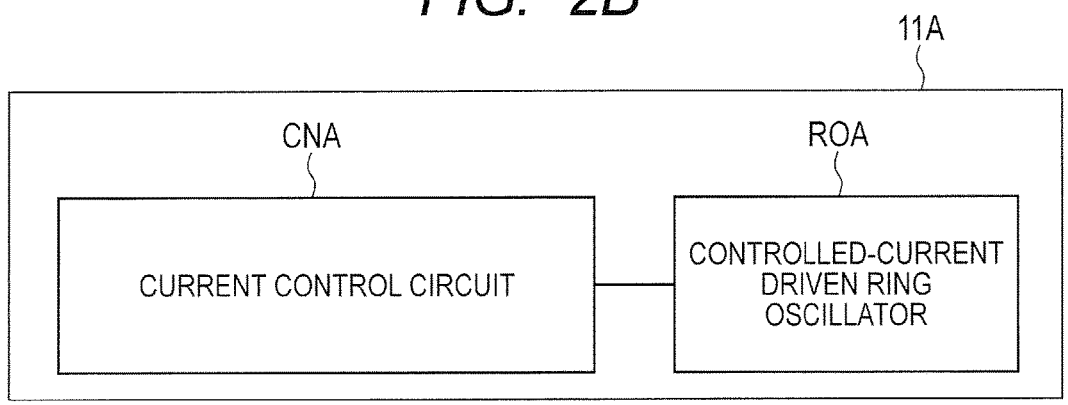
FIG. 2B is a block diagram for use in describing one example of the ring oscillator in FIG. 2A.

FIG. 2B is a block diagram for use in describing one example of the ring oscillator in FIG. 2A. The ring oscillator 11A includes a controlled-current driven ring oscillator ROA and a current control circuit CNA. The current control circuit CNA controls the ring oscillator ROA so that the controlled-current may have large V dependency and T dependency. Further concrete circuit example will be shown in FIGS. 3 to 6 and 9 to 14A.

Figure 2C:
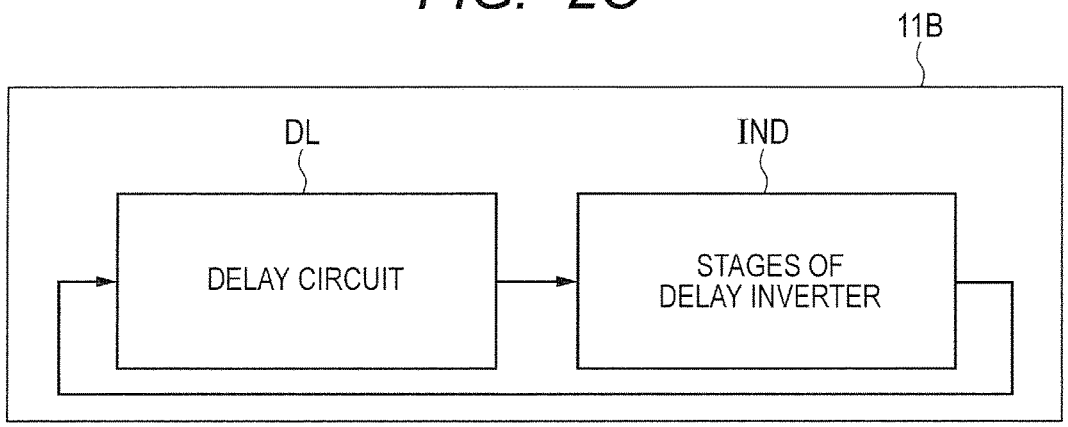
FIG. 2C is a block diagram for use in describing another example of the ring oscillator in FIG. 2A.

FIG. 2C is a block diagram for use in describing another example of the ring oscillator in FIG. 2A. In the ring oscillator 11B, a special delay circuit DL having only a large T dependency is inserted into a plurality of stages of general delay inverters IND. Further concrete circuit example will be shown afterward in FIG. 16A.

Figure 3:
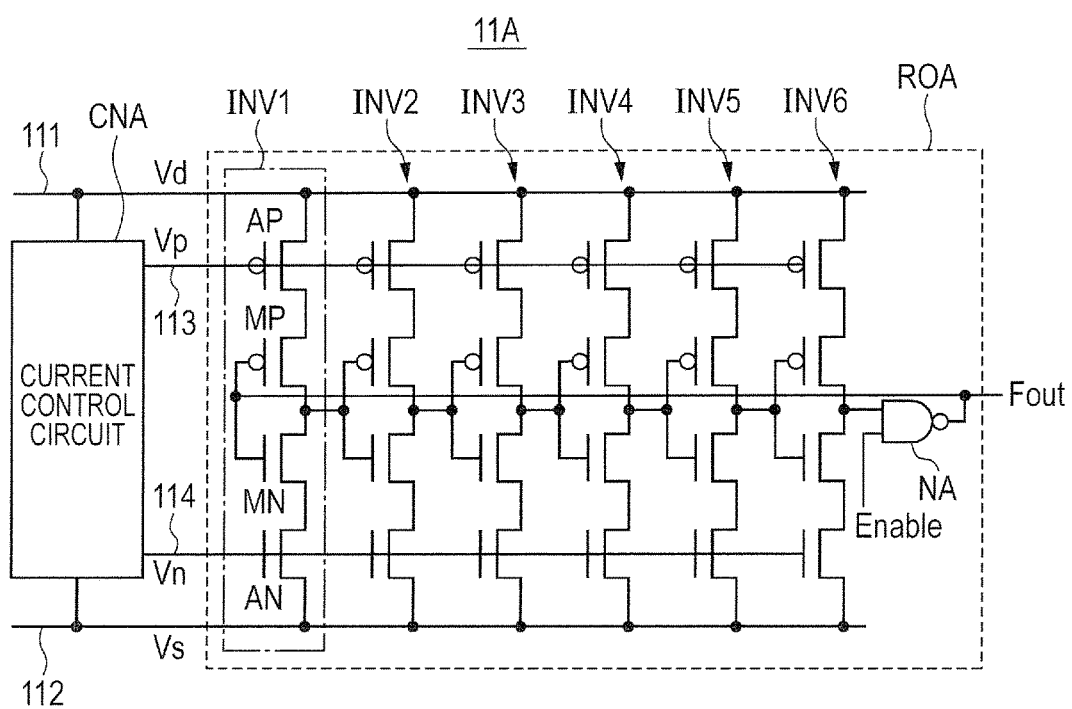
FIG. 3 is a circuit diagram for use in describing a concrete example of the ring oscillator in FIG. 2B.

FIG. 3 is a circuit view showing the ring oscillator in FIG. 2B. The p-th power of the oscillation frequency of the ring oscillator 11A is substantially in proportion to the inverse of the lifetime ($\tau(T, V)$) of the wear-out failure factor. Here, the symbol p is a natural number of single digit, preferably 4 and less. In this schematic example, a loop path formed by six inverters INV1 to INV6 driven by a controlled-current and one NAND gate NA, starts oscillating by making a signal (enable) applied to one input terminal of the NAND gate NA "High". Each of the current driven inverters INV1 to INV6 includes a controlled-current PMOS transistor AP, a controlled-current NMOS transistor AN, a PMOS transistor MP, and an NMOS transistor MN. The source of the controlled-current PMOS transistor AP is coupled to the power supply line 111 to which the power supply potential (Vd) is supplied, and the source of the controlled-current NMOS transistor AN is coupled to a reference line 112 to which a reference potential (Vs) is supplied. Here, when Vs=0V, a potential (voltage) difference between the power supply line 111 and the reference line becomes Vd. Hereinafter, in the case of representing as voltage, it means a potential difference from the potential (Vs=0V) of the reference line 112. In the controlled-current driven inverters INV1 to INV6, when driving the next stage from Low to High, a signal transition time is determined in proportion to the driving current of the controlled-current PMOS transistor AP. When driving the next stage from High to Low, the signal transition time is determined in proportion to the driving current of the controlled-current NMOS transistor AN. The PMOS transistor MP and the NMOS transistor MN having the gate in common, sandwiched by the controlled-current PMOS transistor AP and the controlled-current NMOS transistor AN, work as a switch for selecting either the controlled-current PMOS transistor AP or the controlled-current NMOS transistor AN depending on the oscillation transient state. The gate voltage (Vp) of the controlled-current PMOS transistor AP and the gate voltage (Vn) of the controlled-current NMOS transistor AN are controlled by the current control circuit CNA to respectively have the T and V dependency so that the p-th power of the oscillation frequency of the output Fout may be in proportion to an inverse of the lifetime ($\tau(T, V)$) of the wear-out failure factor.

Figure 4:
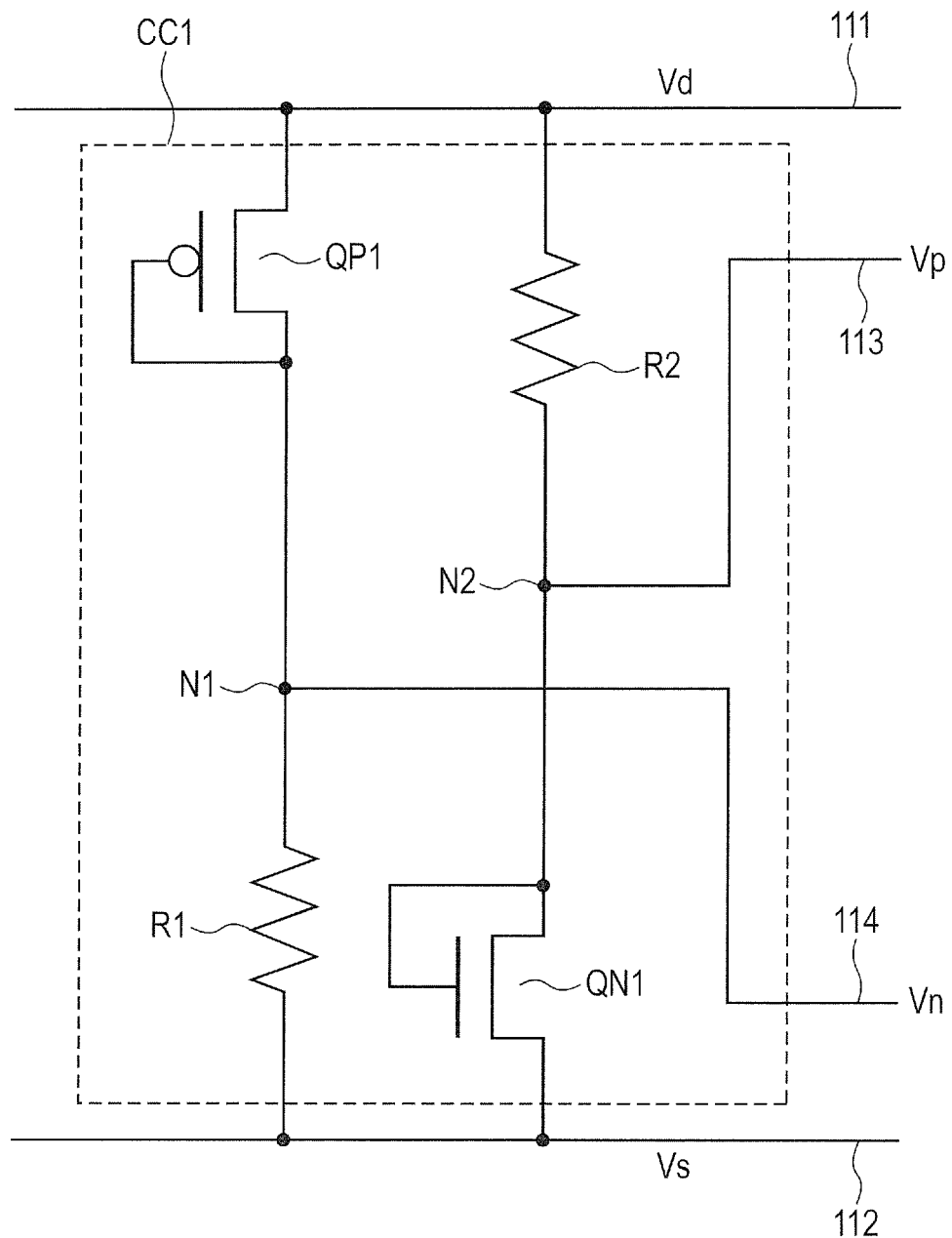
FIG. 4 is a circuit diagram showing a first example of a current control circuit in FIG. 3.
Figure 5:
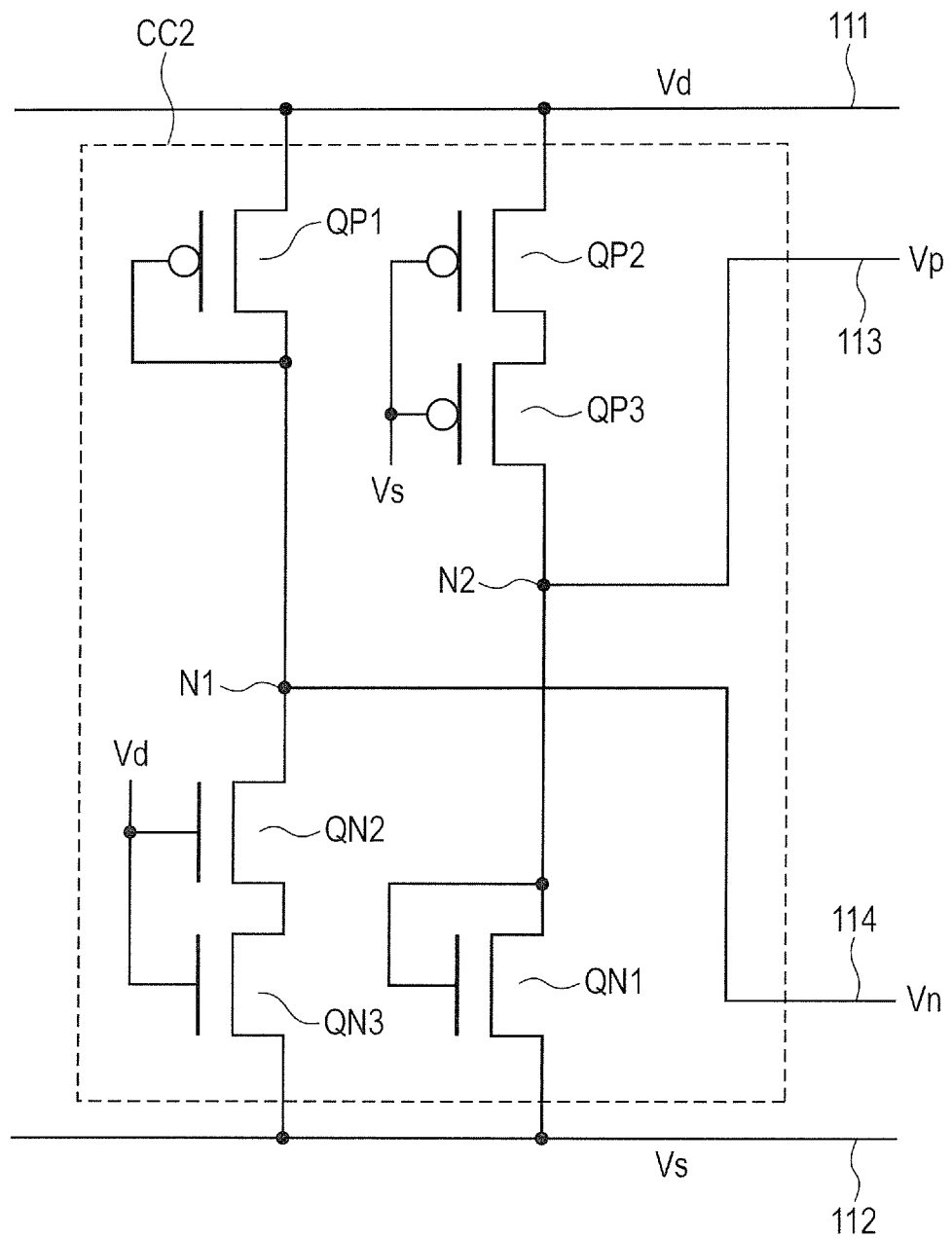
FIG. 5 is a circuit diagram showing a second example of the current control circuit in FIG. 3.
Figure 6:
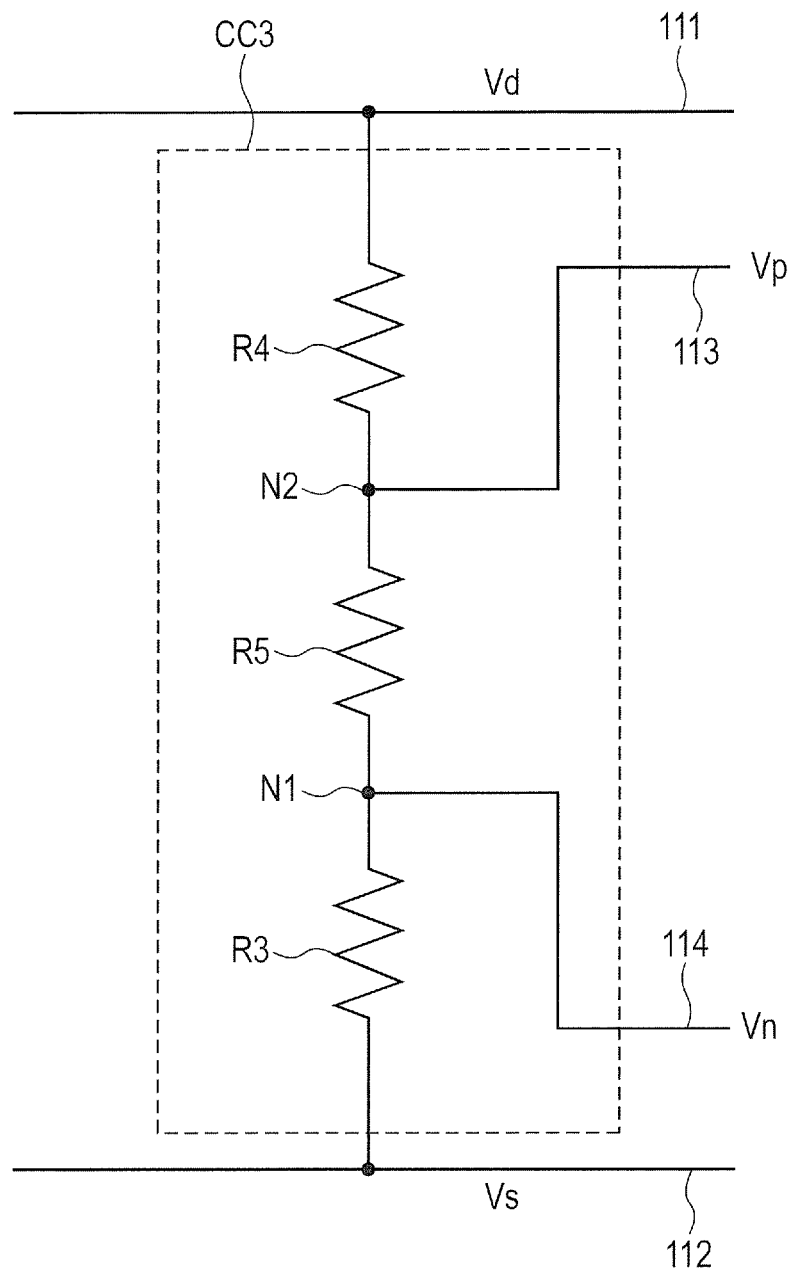
FIG. 6 is a circuit diagram showing a third example of the current control circuit in FIG. 3.

FIG. 4 is a view showing a first schematic example of the current control circuit in FIG. 3. FIG. 5 is a view showing a second schematic example of the current control circuit in FIG. 3. FIG. 6 is a view showing a third schematic example of the current control circuit in FIG. 3.

As shown in FIG. 4, the current control circuit CNA1 includes a voltage generating circuit CC1. The voltage generating circuit CC1 includes a diode-connected PMOS transistor QP1 with the source coupled to the power supply line 111 and a resistance R1 coupled between the drain (node N1) of the PMOS transistor QP1 and the reference line 112. The voltage generating circuit CC1 includes a diode-connected NMOS transistor QN1 with the source coupled to the reference line 112 and a resistance R2 coupled between the drain (node N2) of the NMOS transistor QN1 and the power supply line 111. The node N1 is coupled to an output line 114 and the current control circuit CNA1 supplies the gate voltage (Vn) to the gate of the controlled-current NMOS transistor AN. The node N2 is coupled to an output line 113 and the current control circuit CNA1 supplies the gate voltage (Vp) to the gate of the controlled-current PMOS transistor AP.

As shown in FIG. 5, a current control circuit CNA2 includes a voltage generating circuit CC2. The voltage generating circuit CC2 is formed by replacing the resistance R1 and the resistance R2 of the voltage generating circuit CC1 respectively with the NMOS transistors QN2 and QN3 and the PMOS transistors QP2 and QP3. The NMOS transistors QN2 and QN3 are transistors of long channel and the power supply potential (Vd) is supplied to their gates, to form an effective resistance between the reference line 112 and the output line 114. The PMOS transistors QP2 and QP3 are transistors of long channels, and the reference potential (Vs) is supplied to their gates, to form an effective resistance between the power supply line 111 and the output line 113.

As shown in FIG. 6, a current control circuit CNA3 includes a voltage generating circuit CC3. The voltage generating circuit CC3 includes a resistance R3 with one end coupled to the reference line 112, a resistance R4 with one end coupled to the power supply line 111, and a resistance R5 coupled between the other end of the resistance R3 (node N1) and to the other end of the resistance R4 (node N2). The node N1 is coupled to the output line 114, the current control circuit CNA3 supplies the gate voltage (Vn) to the gate of the controlled-current NMOS transistor AN. The node N2 is coupled to the output line 113 and the current control circuit CNA3 supplies the gate voltage (Vp) to the gate of the controlled-current PMOS transistor AP.

Figure 7A:
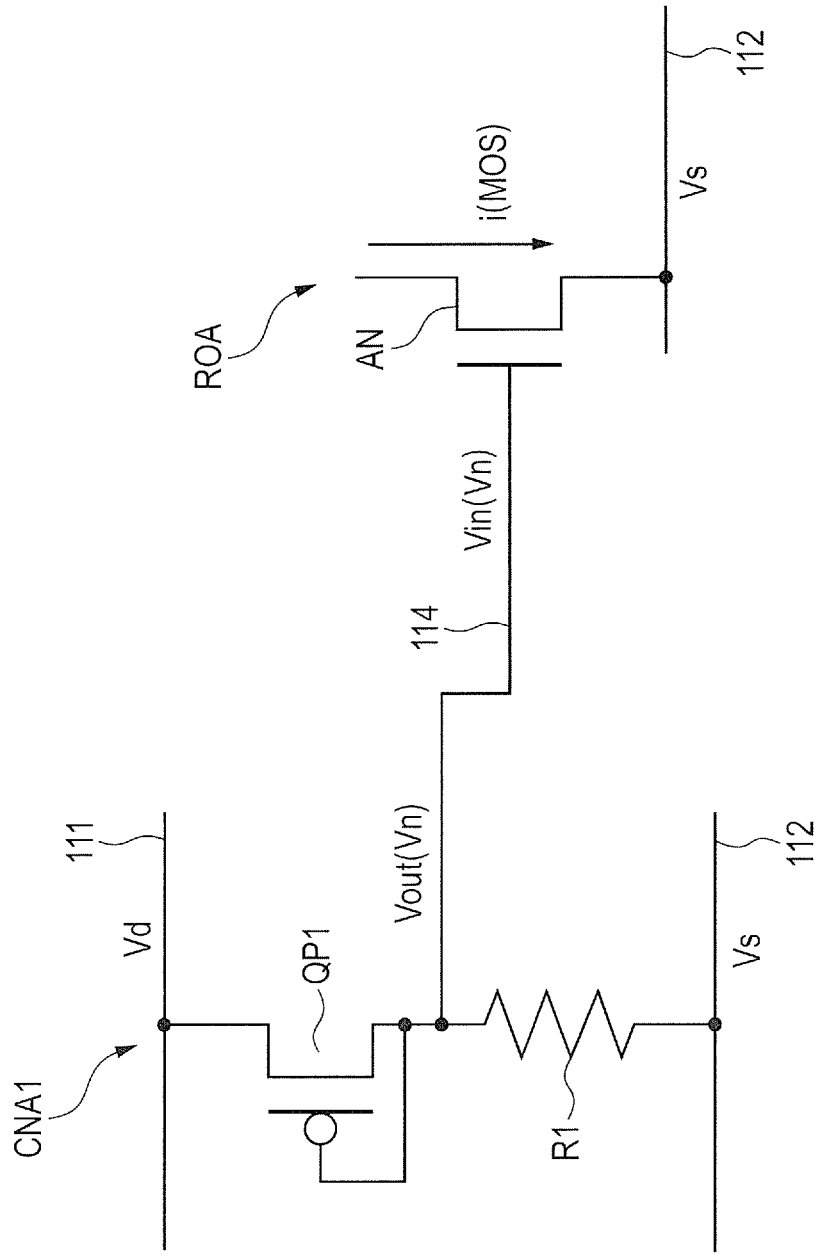
FIG. 7A is a view for use in describing the principle of voltage dependency emphasis by the circuit structure in FIG. 4.
Figure 7B:
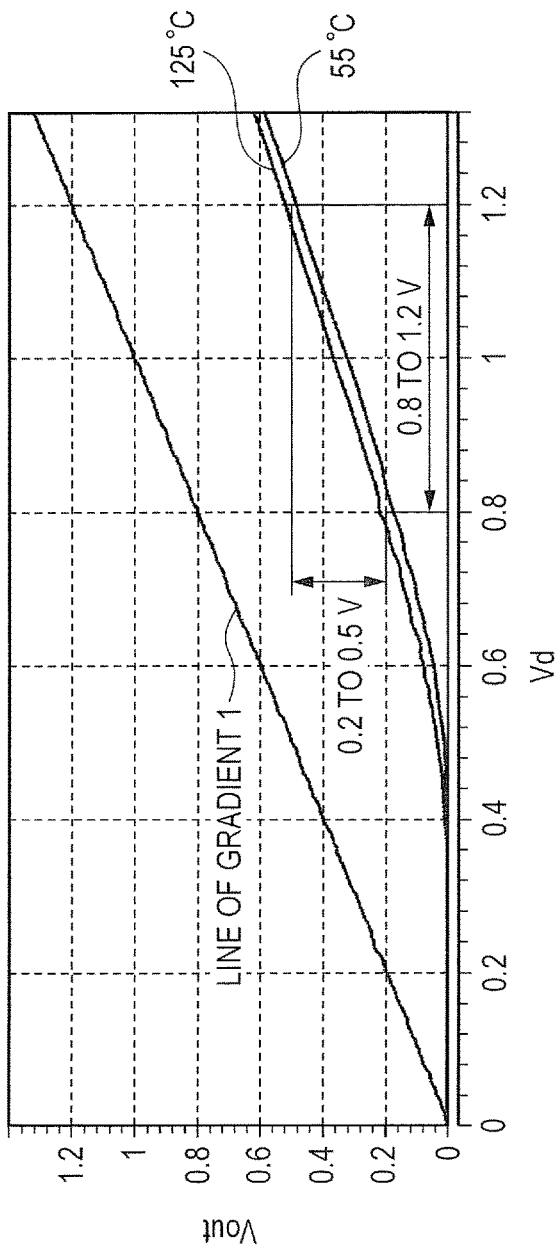
FIG. 7B is a view for use in describing the principle of the voltage dependency emphasis by the circuit structure in FIG. 4.
Figure 7C:
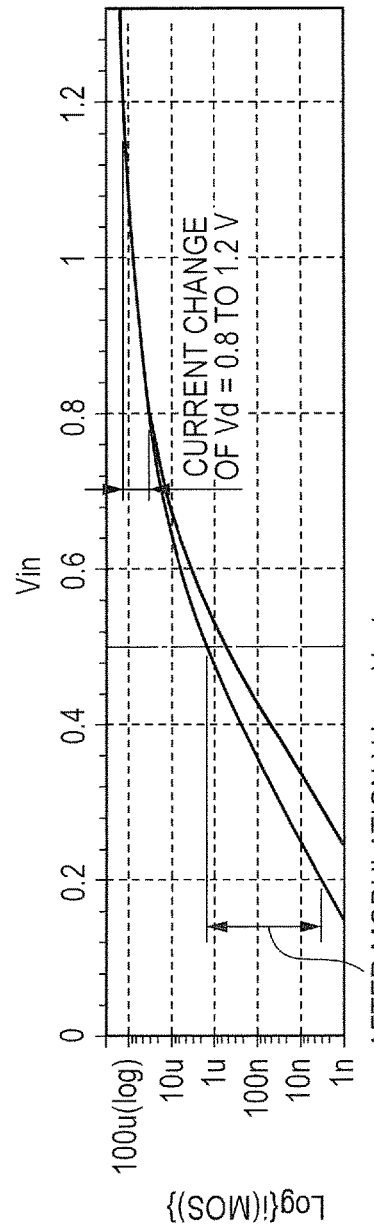
FIG. 7C is a view for use in describing the principle of the voltage dependency emphasis by the circuit structure in FIG. 4.

FIGS. 7A to 7C are views for use in describing the principle of the voltage (V) dependency emphasis by the circuit structure of FIG. 4. FIG. 7A is a circuit diagram showing the current control circuit and the controlled-current NMOS transistor in FIGS. 3 and 4. FIG. 7B is a view showing a relation between Vout and Vd of the current control circuit in FIG. 7A. FIG. 7C is a view showing a relation between Vin and i(MOS) of the controlled-current N-type transistor in FIG. 7A. As shown in FIG. 7B, the Vout becomes a value lower than the power supply potential (Vd) by the voltage (VBE) in the forward direction of diode of the PMOS transistor QP1. When this Vout is given as the gate voltage of the controlled-current NMOS transistor AN and the power supply potential varies, for example, from 0.8 V to 1.2 V, the Vout=Vin varies from 0.2 V to 0.5 V (½ of the power supply potential and the less), and thereby the voltage dependency of a current as shown in FIG. 7C is emphasized. This is because the voltage dependency of the current becomes larger in lower gate voltage.

This is similarly applied to the relation between the current control circuit and the controlled-current PMOS transistor. The Vout becomes a value higher than the reference voltage (Vs) by the voltage VBE of the diode of the NMOS transistor QN1. When the Vout (½ of the power supply line voltage and the more) is given as the gate voltage of the controlled-current PMOS transistor AP, the voltage dependency of a current is emphasized. This is because the voltage dependency of the current becomes larger in a higher gate voltage.

Figure 8A:
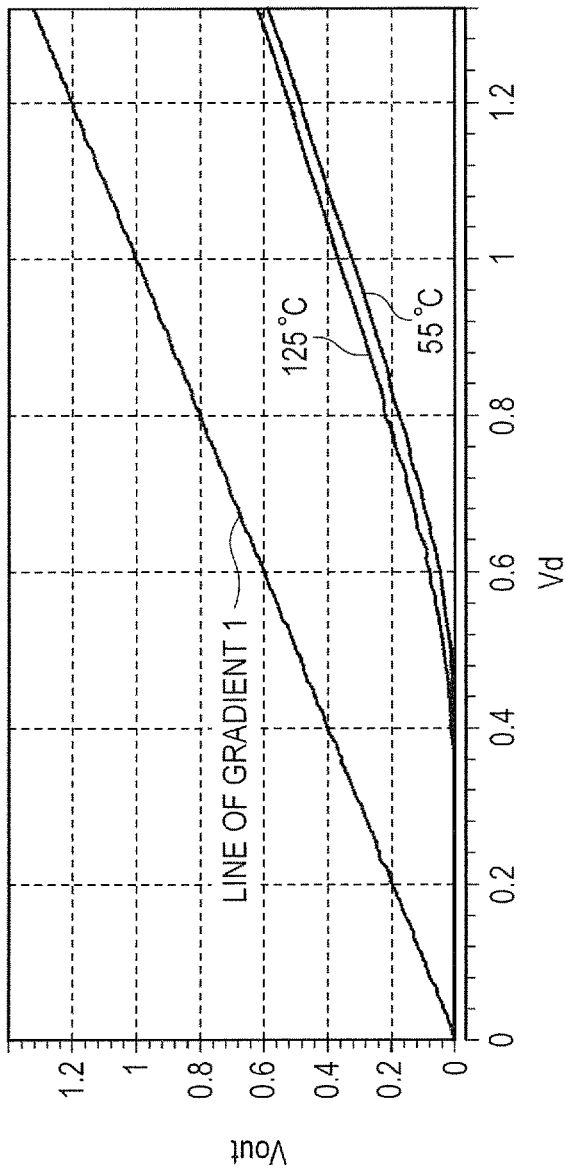
FIG. 8A is a view for use in describing the principle of temperature dependency emphasis by the circuit structure in FIG. 4.
Figure 8B:
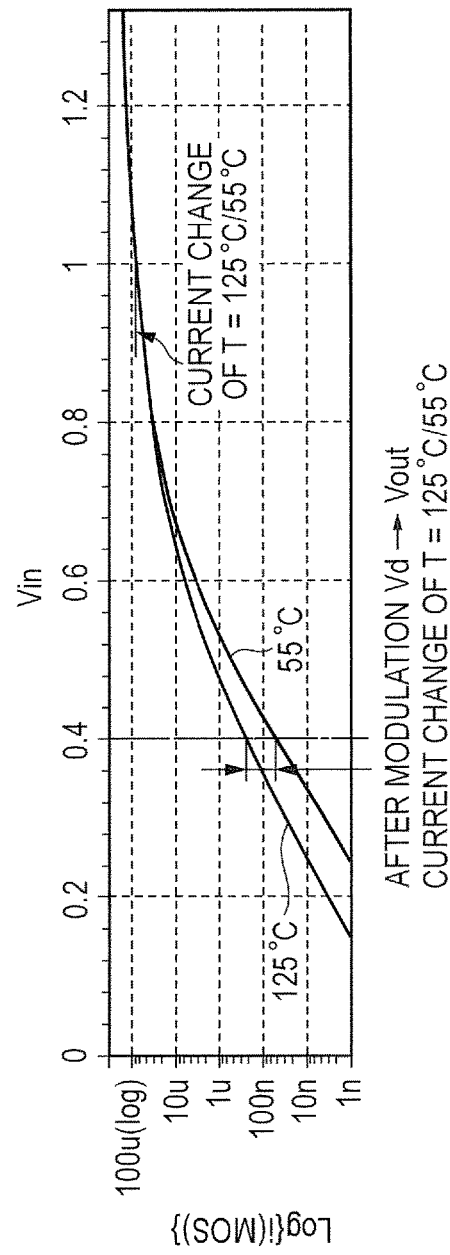
FIG. 8B is a view for use in describing the principle of the temperature dependency emphasis by the circuit structure in FIG. 4.

FIGS. 8A and 8B are views for use in describing the principle of the temperature (T) dependency emphasis by the circuit structure in FIG. 4. FIG. 8A is a view showing a relation between Vout and Vd of the current control circuit in FIG. 7A. FIG. 8B is a view showing a relation between Vin and i(MOS) in the controlled-current NMOS transistor in FIG. 7A. As shown in FIG. 8A, the Vout is a little more reduced at a low temperature, for example, at 55° C. than at a high temperature, for example, at 125° C. In the following description, the temperature difference is not essential. When the Vout is given as the gate voltage of the controlled-current NMOS transistor AN, it results in Vout=Vin=0.4 V (less than ½ of the power supply potential), for example, with respect to the power supply potential of 1 V; therefore, the temperature dependency of the current is emphasized as shown in FIG. 8B. This is because the temperature dependency of the current becomes larger in a lower gate voltage.

This is similarly applied to the relation between the current control circuit and the current power PMOS transistor. When the Vout (½ and more of the power supply potential) is given as the gate voltage of the controlled-current PMOS transistor AP, the temperature dependency of the current is emphasized. This is because the temperature dependency of the current becomes larger in a higher gate voltage.

According to the circuit structure example having been described in FIGS. 3 to 6, it is possible to know the cumulative stress amount of wear-out failure by the ring oscillator in a simple structure.

Figure 9:
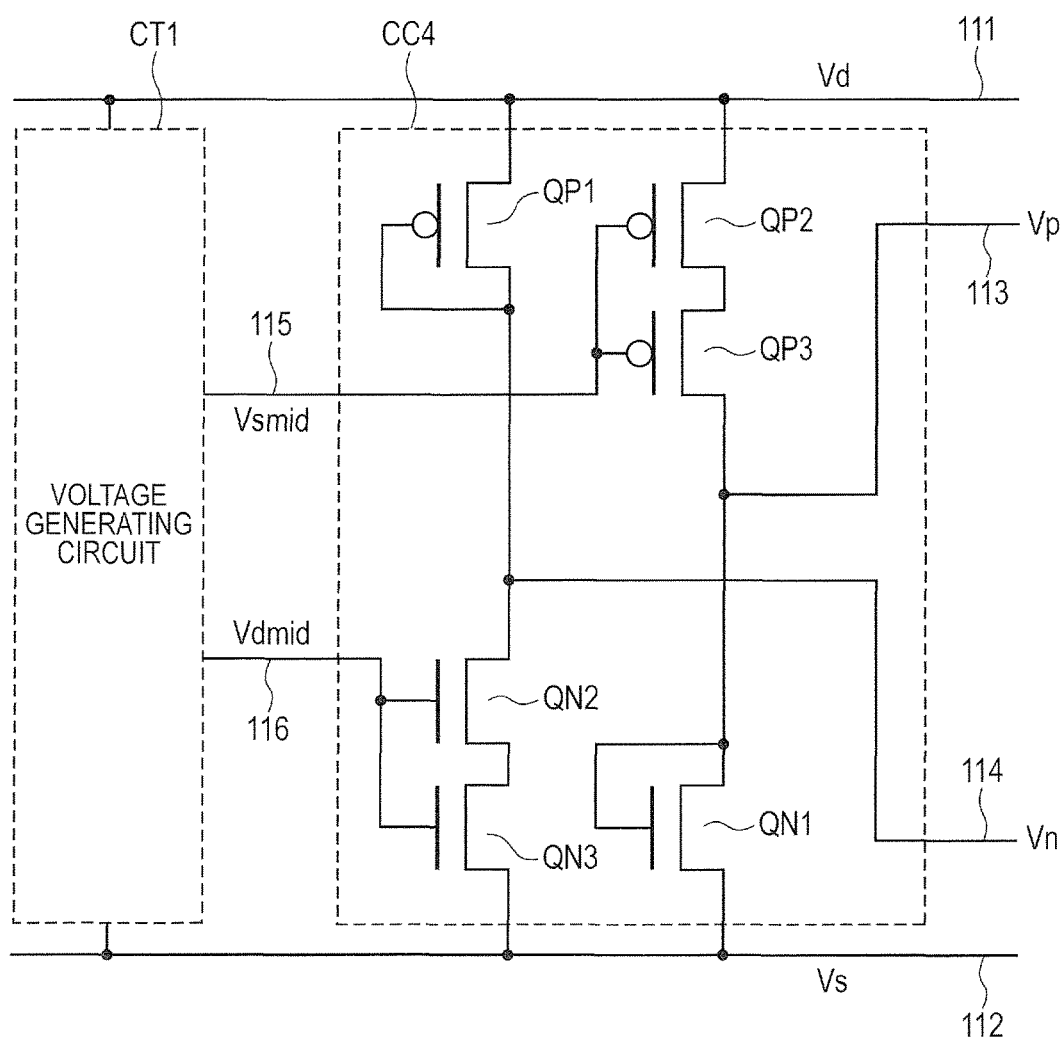
FIG. 9 is a circuit diagram showing a fourth example of the current control circuit in FIG. 3.

FIG. 9 is a view showing a fourth schematic example of the current control circuit in FIG. 3. A controlled-current circuit CNA4 includes a voltage generating circuit CC4 for controlling the controlled-current PMOS transistor AP and NMOS transistor AN of the ring oscillator ROA and a voltage generating circuit CT1 for T and V dependency secondary adjustment. In the voltage generating circuit CC2 in FIG. 5, the gates of the long channel NMOS transistors QN2 and QN3 are fixed to the power supply potential (Vd) and the gates of the PMOS transistors QP2 and QP3 are fixed to the reference voltage (Vs). On the contrary, in the voltage generating circuit CC4 of the fourth schematic example in FIG. 9, an output line 115 of the voltage generating circuit CT1 for the T and V dependency secondary adjustment is coupled to the gates of the PMOS transistors QP2 and QP3 and an output line 116 is coupled to the gates of the NMOS transistors QN2 and QN3. Other than this, the voltage generating circuit CC4 is the same as the voltage generating circuit CC2. The voltage (Vsmid) of the output line 115 of the voltage generating circuit CT1 for the T and V dependency secondary adjustment and the voltage (Vdmid) of the output line 116 have the T and V dependency. Modulations of the Vsmid and the Vdmid respectively change the effective resistance values of the long channel PMOS transistors QP2 and QP3 and the NMOS transistors QN2 and QN3, resulting in changing the degree of the lower voltage conversion of the power supply potential having been described in FIGS. 7A to 8B. By adjusting both the power supply potential (Vd) and the temperature (T) dependency of the Vsmid and the Vdmid by the voltage generating circuit CT1, the V and T dependency of the oscillation frequency of the ring oscillator ROA can be secondarily adjusted to the desired.

Figure 10:
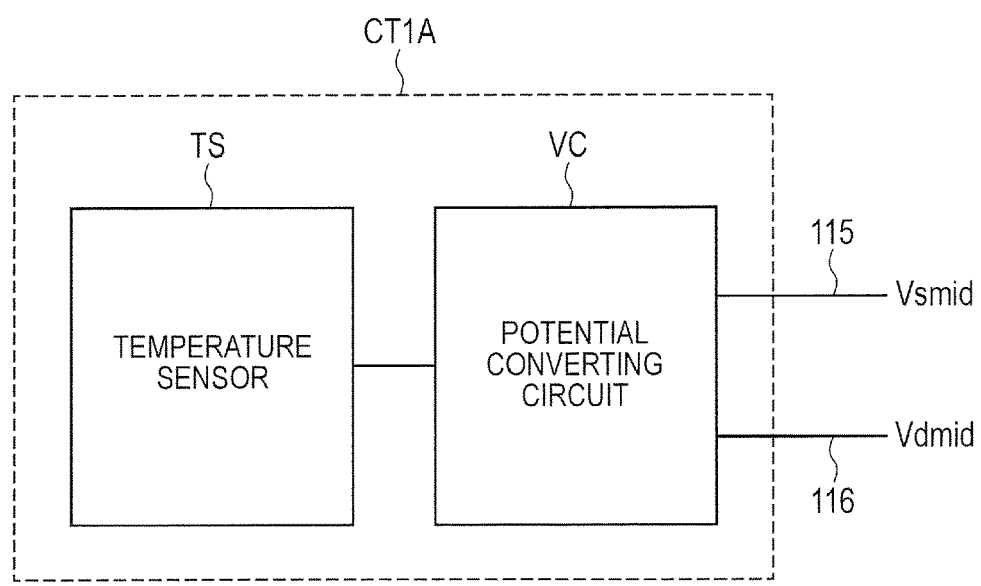
FIG. 10 is a block diagram showing a first example of a voltage generating circuit in FIG. 9.
Figure 11:
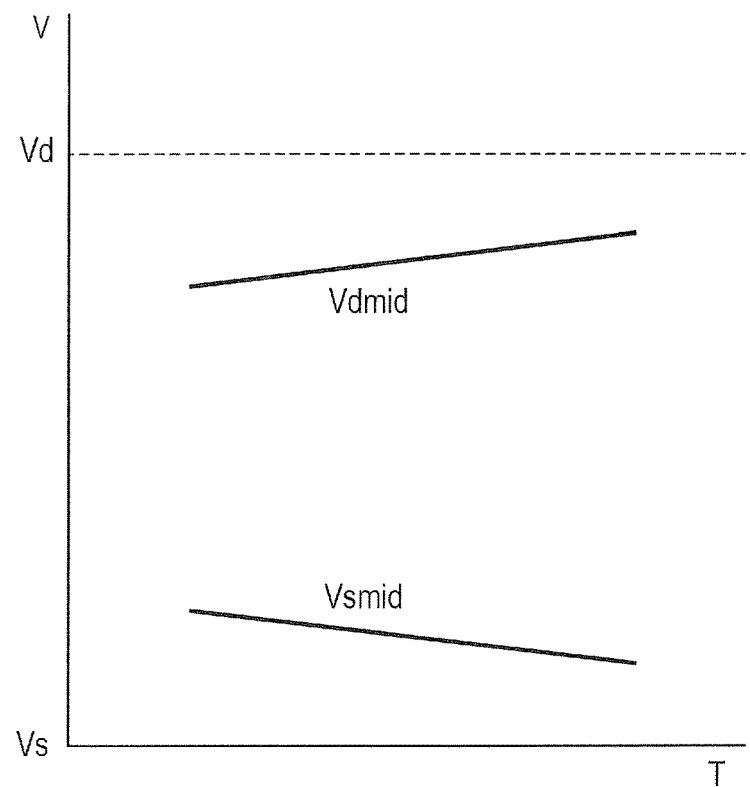
FIG. 11 is a view showing temperature characteristic of the voltage generating circuit in FIG. 10.

FIG. 10 is a view showing the schematic example of the voltage generating circuit for the T and V dependency secondary adjustment in FIG. 9. FIG. 11 is a view showing a relation between the temperature and the voltage of Vsmid and Vdmid. The voltage generating circuit CT1A performs the potential conversion in a potential converting circuit VC based on the output voltage of a temperature sensor TS; then, as shown in FIG. 11, Vdmid is higher than Vsmid, and the Vdmid has a positive temperature dependency such as having a higher voltage according to a higher temperature, and the Vsmid has a negative temperature dependency such as having a lower voltage according to a higher temperature dependency.

Figure 12:
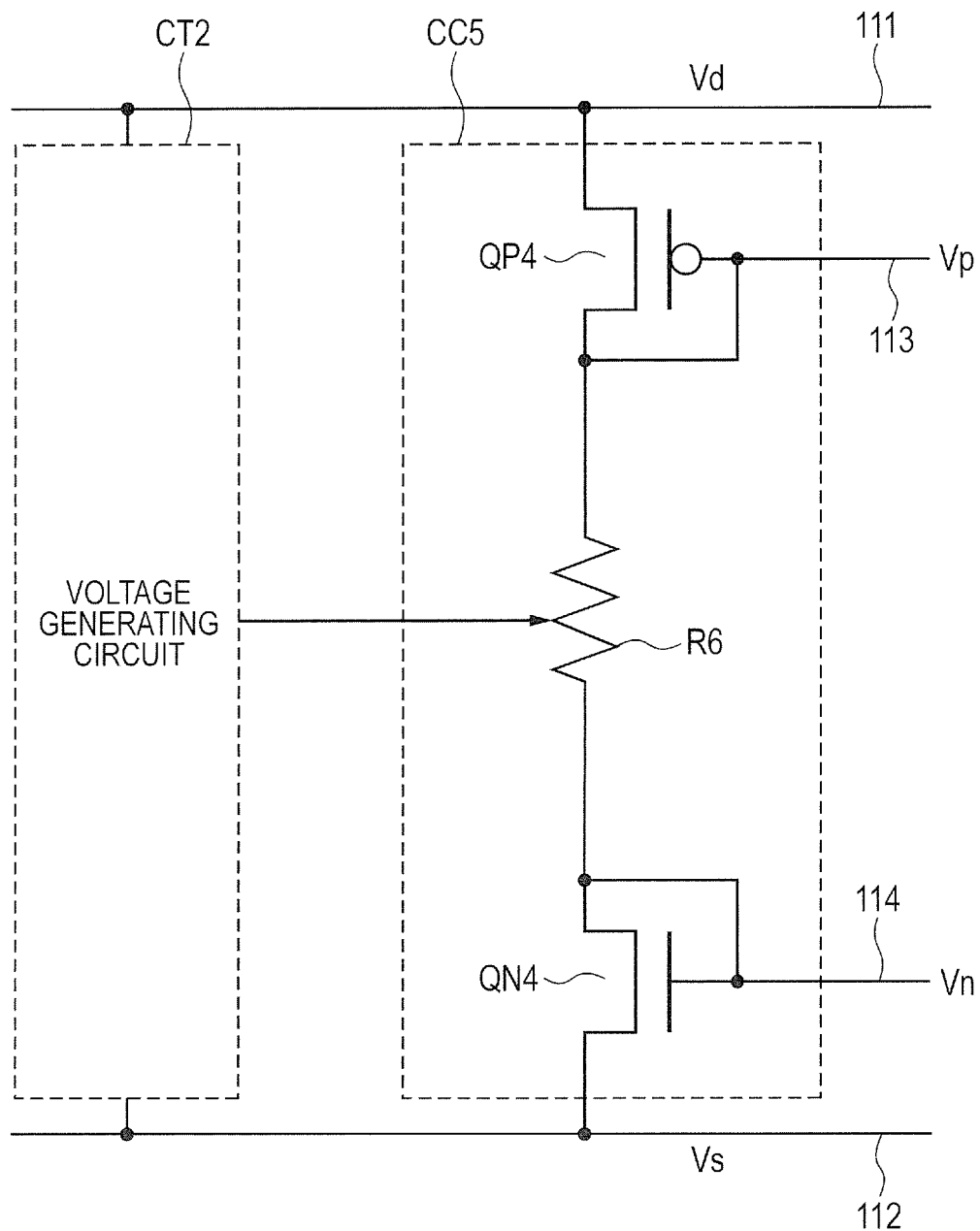
FIG. 12 is a circuit diagram showing a fifth example of the current control circuit in FIG. 3.

FIG. 12 is a view showing a fifth schematic example of the current control circuit in FIG. 3. A current control circuit CNA5 includes a voltage generating circuit CC5 for controlling the controlled-current PMOS transistor AP and the controlled-current NMOS transistor AN of the ring oscillator ROA and a voltage generating circuit CT2 for the T and V dependency secondary adjustment. The voltage generating circuit CC5 includes a diode-connected PMOS transistor QP4, an effective resistance R6, and a diode-connected NMOS transistor QN4. The gate and drain of the PMOS transistor QP4 are coupled to the output line 113 and the source is coupled to the power supply line 111. The gate and drain of the NMOS transistor QN4 are coupled to the output line 114 and the source is coupled to the reference line 112. The diode-connected PMOS transistor QP4 converts the power supply potential (Vd) into a lower voltage, the diode-connected NMOS transistor QN4 converts the reference voltage (Vs) into a higher voltage, and the converted voltage is adjusted by the effective resistance R6. The resistance value of the effective resistance R6 is secondarily adjusted by the voltage generating circuit CT2.

The power supply potential is converted into a lower voltage and supplied to the gate of the current power NMOS transistor AN of the ring oscillator ROA and the reference voltage is converted into a higher voltage and supplied to the gate of the current power PMOS transistor AP of the ring oscillator ROA; therefore, according to the principle having been described in FIGS. 7A to 8B, there can be obtained a ring oscillator showing an oscillation frequency of a large voltage (V) and temperature (T) dependency highly correlated with the stress amount of the wear-out failure.

Figure 13:
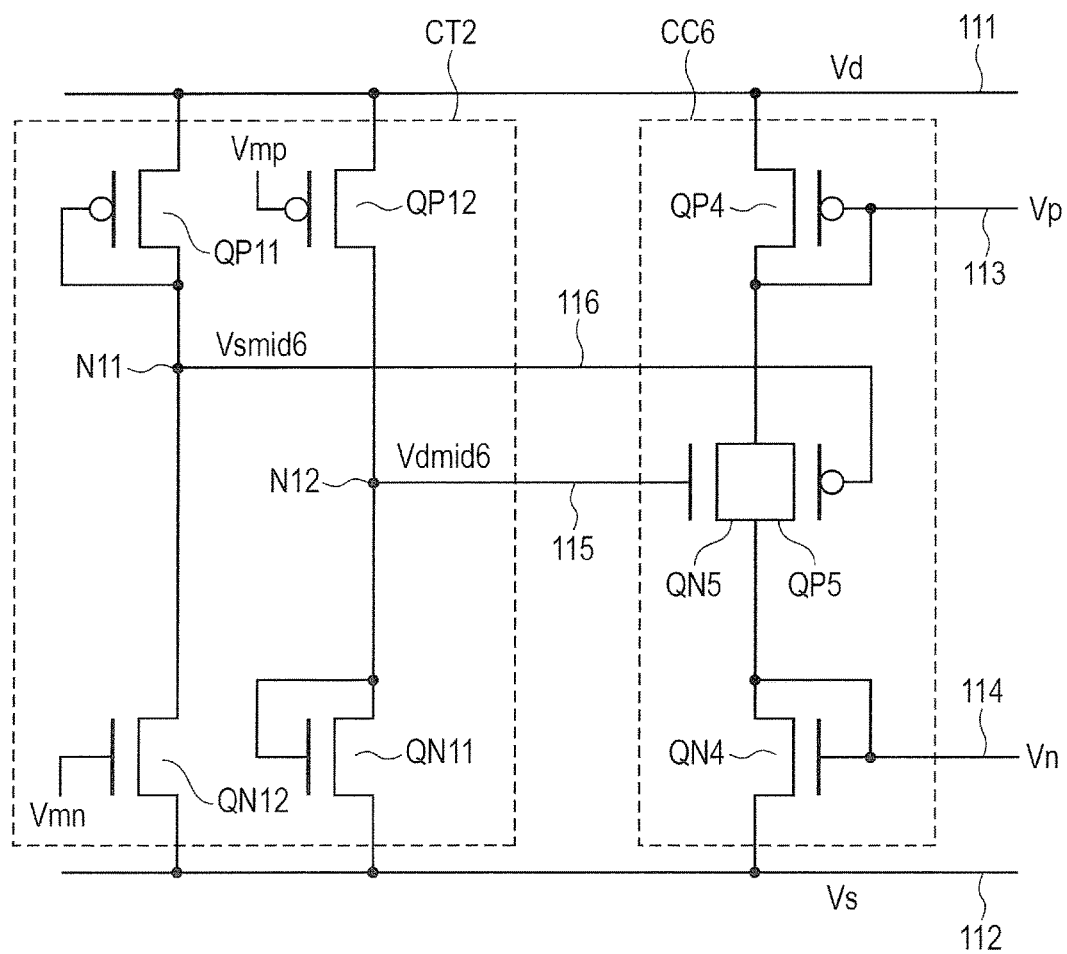
FIG. 13 is a circuit diagram showing a sixth example of the current control circuit in FIG. 3.

FIG. 13 is a view showing the schematic example of the current control circuit in FIG. 12. A current control circuit CNA6 includes a voltage generating circuit CC6 for controlling the controlled-current PMOS transistor AP and the controlled-current NMOS transistor AN of the ring oscillator ROA and the voltage generating circuit CT2 for the T and V dependency secondary adjustment. The voltage generating circuit CC6 is formed by replacing the effective resistance R6 of the voltage generating circuit CC5 with the NMOS transistor QN5 and the PMOS transistor QP5. The NMOS transistor QN5 is a long channel transistor, with Vdmid6 supplied to the gate, hence to form an effective resistance. The PMOS transistor QP5 is a long channel transistor, with Vsmid6 supplied to the gate, hence to form an effective resistance.

In the voltage generating circuit CT2 The NMOS transistor QN12 is a long channel transistor, with the potential (Vmn) supplied to the gate, hence to form an effective resistance. The PMOS transistor QP12 is a long channel transistor, with the potential (Vmp) supplied to the gate, hence to form an effective resistance.

The node N11 is coupled to the gate of the PMOS transistor QP5, and the voltage generating circuit CT2 supplies the gate voltage (Vsmid6). The node N12 is coupled to the gate of the NMOS transistor QN5 and the voltage generating circuit CT2 supplies the gate voltage (Vdmid6).

According to the circuit structure having been described in FIGS. 9 to 13, it is possible to know the cumulative stress amount of the wear-out failure accurately.

Figure 14A:
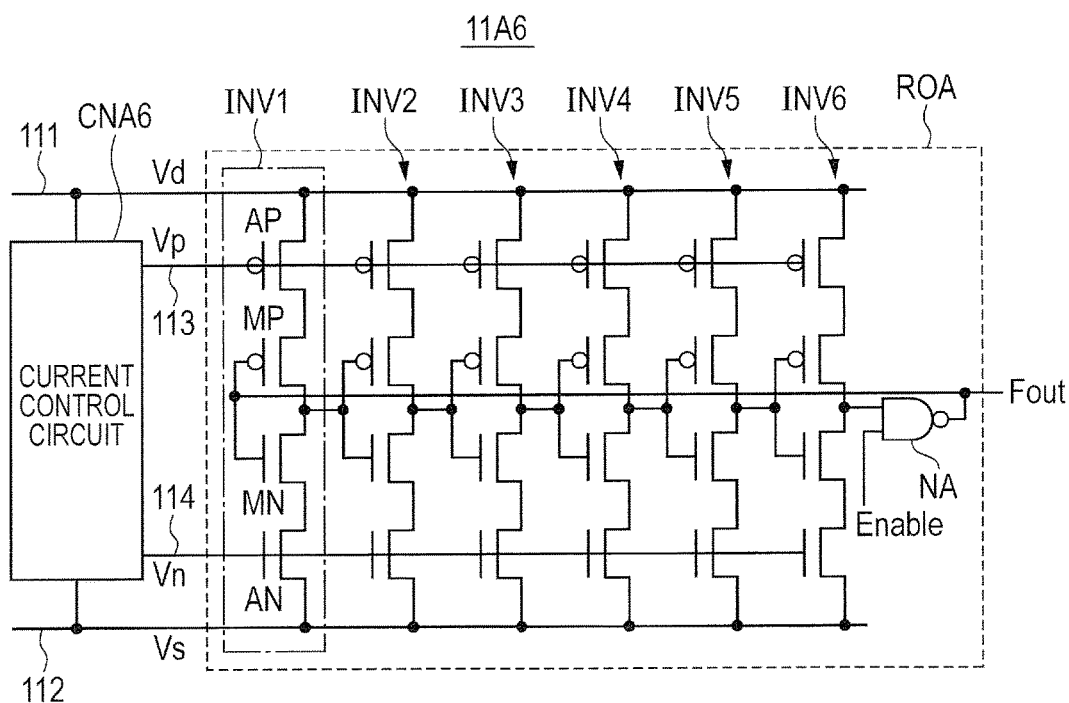
FIG. 14A is a circuit diagram showing a ring oscillator using the current control circuit in FIG. 13.
Figure 14B:
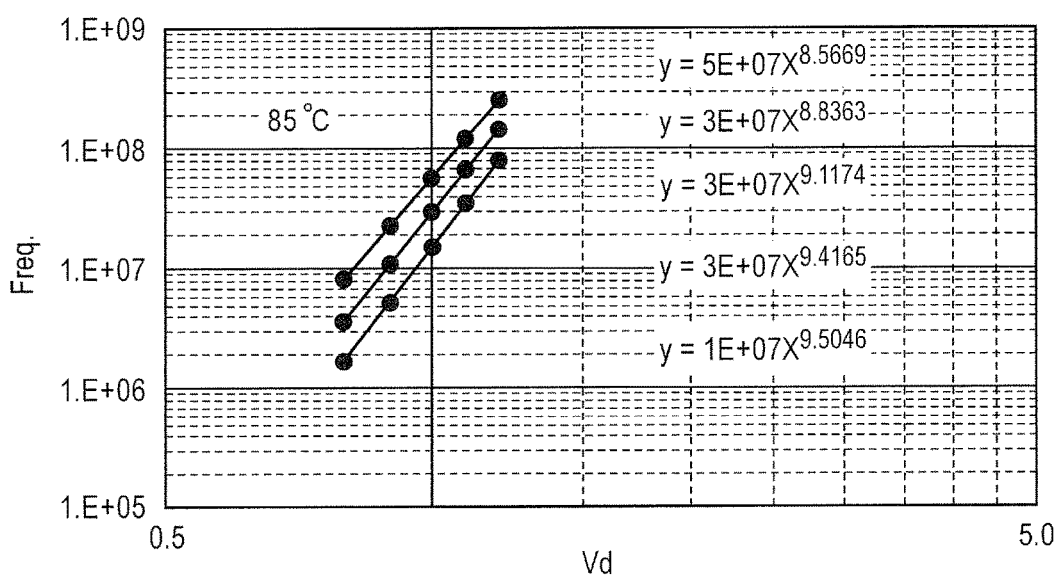
FIG. 14B is a view showing voltage dependency of the oscillation frequency of the ring oscillator in FIG. 14A.
Figure 14C:
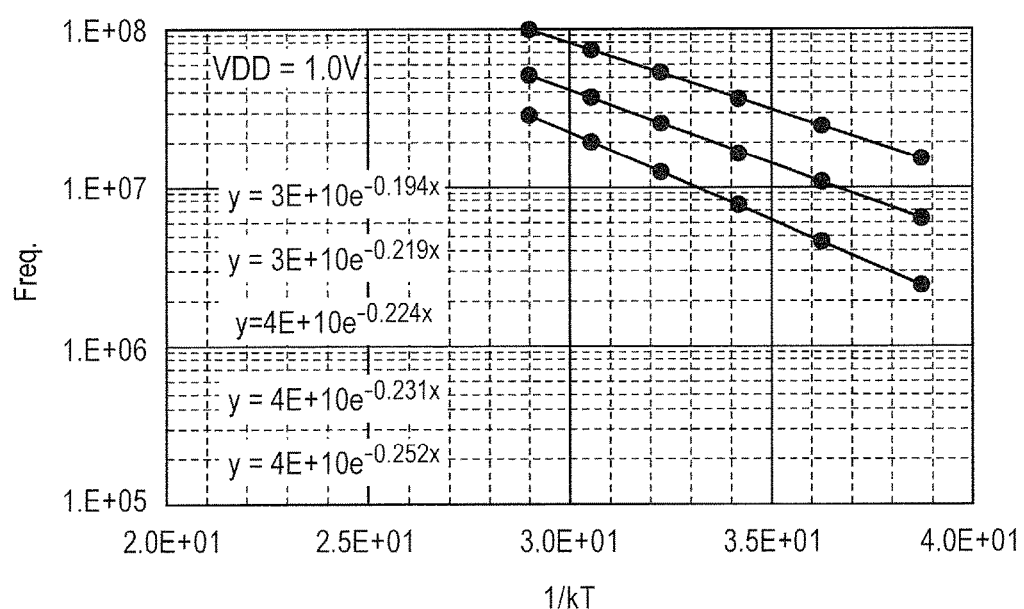
FIG. 14C is a view showing temperature dependency of the oscillation frequency of the ring oscillator in FIG. 14A.

FIG. 14A is a view showing a ring oscillator using the current control circuit in FIG. 13. FIG. 14B is a view showing the voltage dependency of the oscillation frequency of the ring oscillator in FIG. 14A. FIG. 14C is a view showing the temperature dependency of the oscillation frequency of the ring oscillator in FIG. 14A.

As shown in FIG. 14A, the ring oscillator 11A6 includes a ring oscillator ROA and a current control circuit CNA6.

As shown in FIG. 14B, the oscillation frequency (Freq) of the ring oscillator 11A6 is in proportion to $V^{m0}$ (Freq$\propto V^{m0}$). Here, m0=8.5 to 9.5. In other words, the voltage has the power dependency with m0=almost 10.

As shown in FIG. 14C, the oscillation frequency (Freq) of the ring oscillator 11A6 is in proportion to $\exp(-Ea0/kT)$ (Freq$\propto \exp(-Ea0/kT)$). Here, Ea0=0.2 to 0.25 eV. In other words, the inverse of temperature has the exponential dependency with Ea=0.2 to 0.25 eV. Therefore, Freq is in the relation of the following expression (5).

$$\text{Freq} \propto V^{m0} \times \exp(-Ea0/kT) \tag{5}$$

Further, according to the expressions (1) and (3), $$\{F(T,V)\}^p \propto V^n \times \exp(-Ea/kT) \tag{6}$$

Here, when Freq=F(T, V), according to the expressions (5) and (6), $$n = m0 * p \tag{7}$$

$$Ea = Ea0 * p \tag{8}$$

Here, when m0=8.5 to 9.5, Ea0=0.2 to 0.25 eV, and p=4, $$n = (8.5 \text{ to } 9.5) \times 4 = 34 \text{ to } 38, \text{ and}$$

$$Ea = (0.2 \text{ to } 0.25) \times 4 \text{ eV} = 0.8 \text{ to } 1 \text{ eV}.$$

Therefore, degradation phenomenon having the V and T dependency with n of 40 and Ea of 1 eV can be monitored. In other words, when the wear-out failure factor has the voltage power dependency of around n=40 and the temperature exponential dependency of around Ea=1 eV, it corresponds to a ring oscillator of p=4. As a result, when the oscillation frequency is raised to the fourth power, the cumulative degradation stress count can be obtained. Alternatively, when the wear-out failure factor has the voltage power dependency of around n=10 and the temperature exponential dependency of around Ea=0.25 eV, it corresponds to a ring oscillator of p=1. As a result, when the oscillation count is accumulated as it is, the cumulative deterioration stress count can be obtained.

Figure 15A:
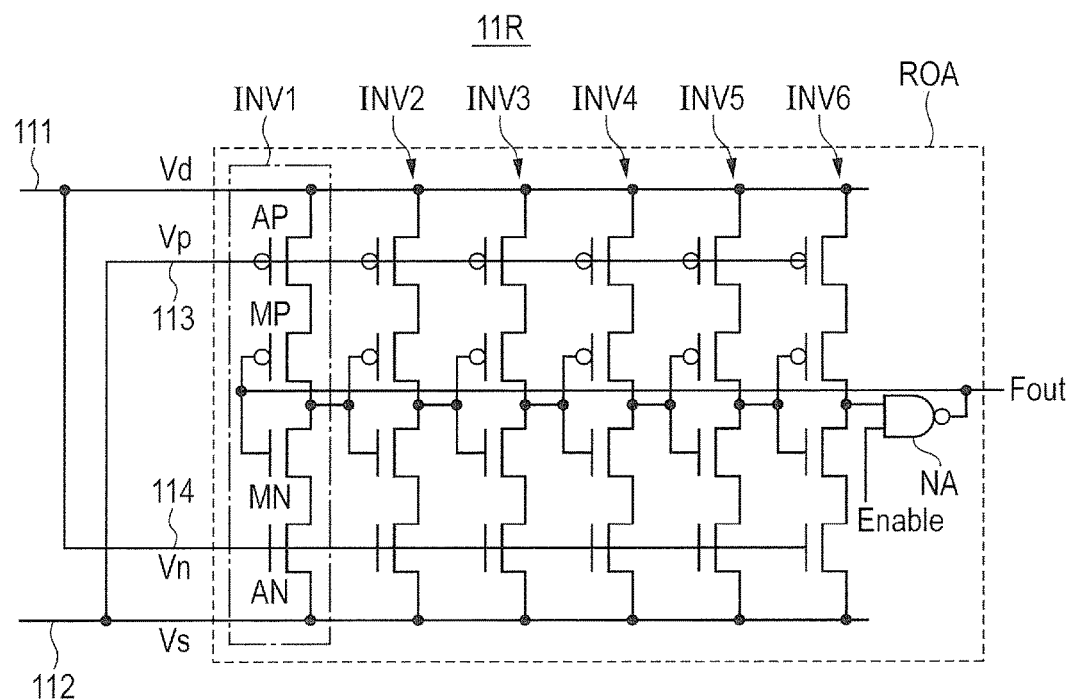
FIG. 15A is a circuit diagram showing the structure of a ring oscillator according to a comparison example.
Figure 15B:
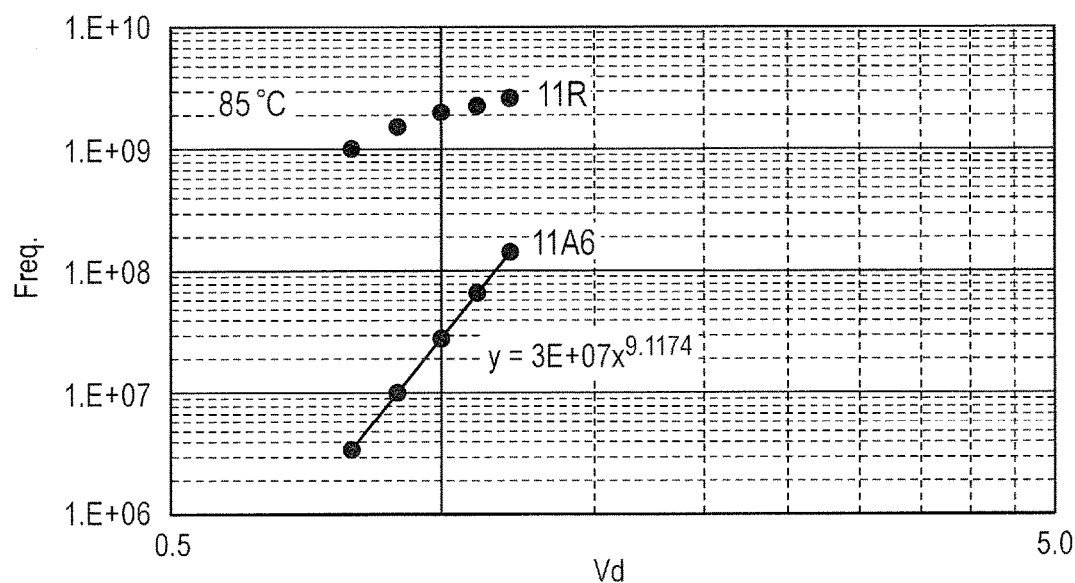
FIG. 15B is a view comparing the voltage dependency of the oscillation frequency between the ring oscillator in FIG. 14A and the ring oscillator in FIG. 15A.
Figure 15C:
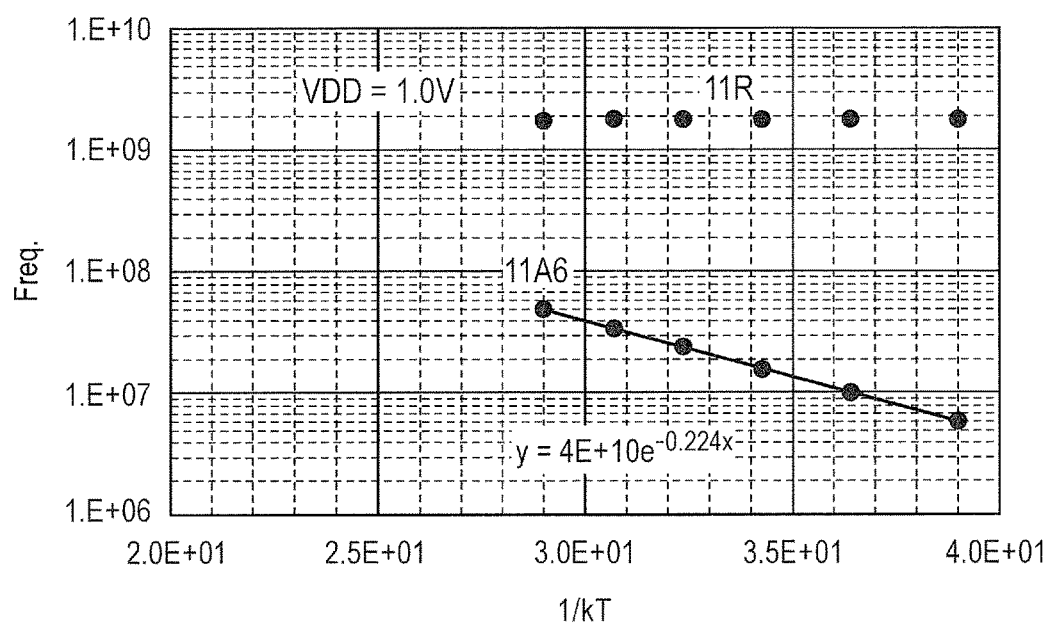
FIG. 15C is a view comparing the temperature dependency of the oscillation frequency between the ring oscillator in FIG. 14A and the ring oscillator in FIG. 15A.

FIG. 15A is a view showing the structure of a ring oscillator according to a comparison example. FIG. 15B is a view showing the voltage dependence of the oscillation frequency of the ring oscillator using the current control circuit of FIG. 13 and the ring oscillator according to a comparison example. FIG. 15C is a view showing the temperature dependency of the oscillation frequency of the ring oscillator using the current control circuit of FIG. 13 and the ring oscillator according to a comparison example.

As shown in FIG. 15A, the ring oscillator 11R includes the ring oscillator ROA. Here, Vp=Vs and Vn=Vd. Therefore, the controlled-current transistors are fully on, with the gate voltage of the controlled-current PMOS transistor AP of the ring oscillator ROA fixed at Vs and the gate voltage of the controlled-current NMOS transistor AN fixed at Vd, and the inverters INV1 to INV6 are made in the same circuit state as that of the normal inverter.

As shown in FIG. 15B, the reference ring oscillator 11R according to a comparison example shows a small change of less than 2× in terms of frequency in the voltage range where the ring oscillator 11A6 shows a large change of one order of magnitude.

Further, as shown in FIG. 15C, the reference ring oscillator 11R according to a comparison example shows little change in the logarithm scale when temperatures vary.

On the contrary, the ring oscillator 11A6 of the embodiment can express the large voltage and temperature dependency (power, exponential dependency) of wear-out failure as the oscillation frequency.

Figure 16A:
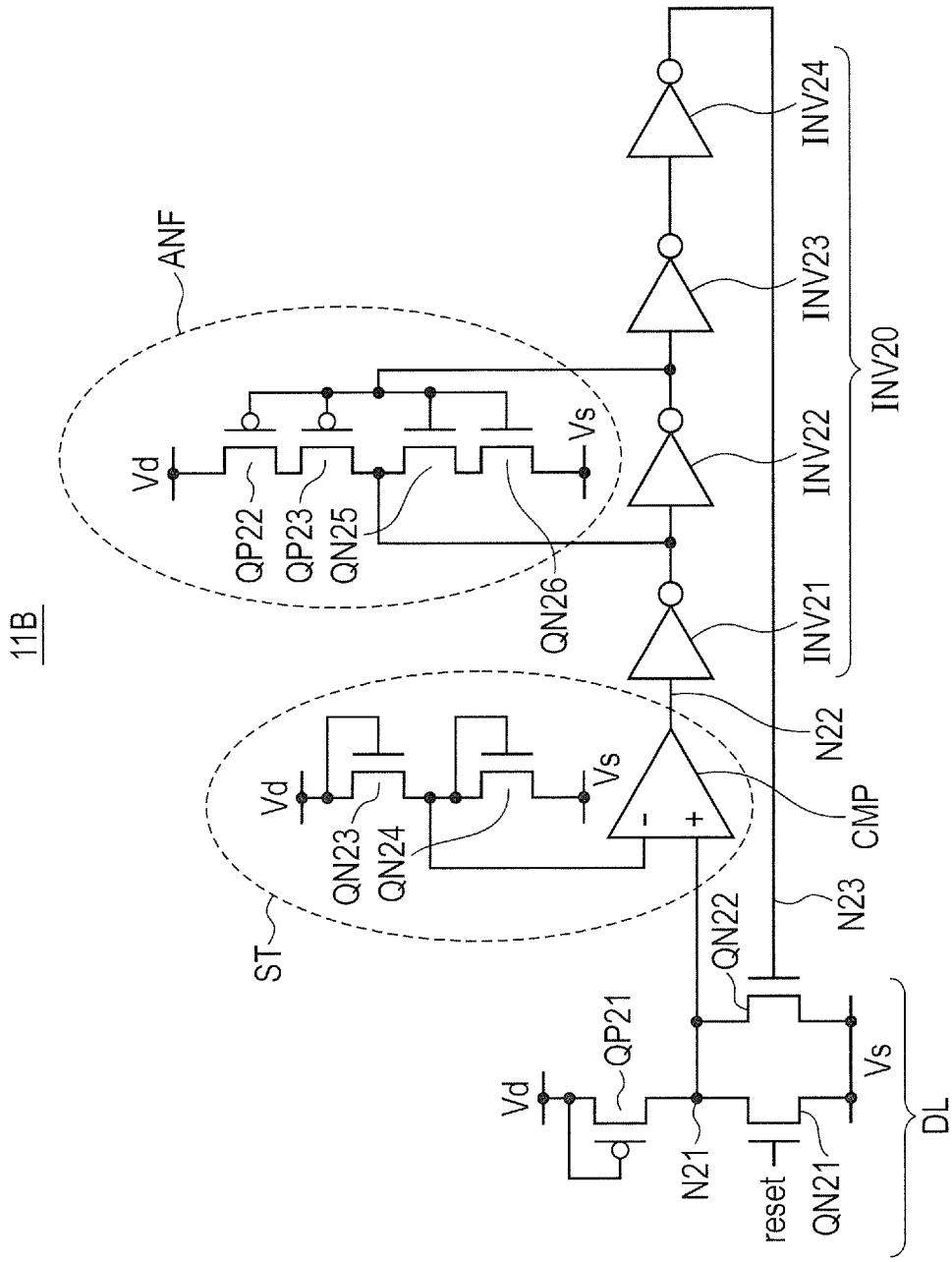
FIG. 16A is a circuit diagram for use in describing a concrete example of the ring oscillator in FIG. 2C.

FIG. 16A is a circuit diagram showing the structure of the ring oscillator in FIG. 2C. In the ring oscillator 11B, the p-th power of the oscillation frequency is almost in proportion to the inverse of the lifetime τ(T) of the wear-out failure factor. The symbol p is a natural number of single digit, preferably 4 and less. If the wear-out failure factor has a small voltage dependency and a large temperature dependency, for example, like the electromigration and the stress migration, the cumulative degradation stress amount of the wear-out failure factor can be obtained from the oscillation frequency of the ring oscillator 11B. The ring oscillator 11B achieves the oscillation frequency in proportion to the off current of the PMOS transistor. Alternatively, it can do the above in proportion to the off current of the NMOS transistor, instead of the PMOS transistor. As the result, the p-th power of the oscillation frequency is in proportion to the exponential of the inverse of the temperature.

The ring oscillator 11B includes a delay circuit DL, a stabilization circuit ST, and a delay inverter group INV20. The delay circuit DL includes a PMOS transistor QP21 and NMOS transistors QN21 and QN22. The stabilization circuit ST includes NMOS transistors QN23 and QN24 for generating a reference voltage (Vref) and a comparator CMP. The delay inverter group INV20 includes inverters INV21, INV22, INV23, and INV24.

The operation will be described hereinafter. When a reset signal (reset) becomes a high level, the node N21 is reset at a low level. The reference Vref is an intermediate potential between the high level (Vd) and the low level (Vs) and the output node N22 of the comparator (differential amplifier) CMP becomes the low level. As the result, the node N23 becomes the low level, and after the rest signal is returned to a low level, the node N21 comes into a floating state. When each threshold voltage absolute value of the NMOS transistors QN21 and QN22 is set at a value larger than the threshold voltage absolute value of the PMOS transistor QP21, the off leakage current of the PMOS transistor QP21 is dominant and the potential of the node N21 gradually rises from a low level to a high level. The PMOS transistor QP21 is a leakage pull-up element. When the potential of the node N21 becomes Vref and more, the output node N22 of the AMP comparator CMP changes from a low level to a high level, and after a delay of the inverter group INV20 (inverters INV21 to INV24 of four stages), the node N23 becomes a high level. As the result, the node N21 returns to a low level. Oscillation is performed through this repetition.

Time period after the node N21 shifts from a low level to a high level, until returning to a low level, is substantially equal to the sum of the time period (t1) that the potential of the node N21 rises from a low level to Vref due to the off leakage current of the PMOS transistor QP21 and the time period (t2) after the node N22 reaches at a high level until the node N21 reaches at a high level due to the delay of the inverter group INV20. Further, since t1>>t2, the oscillation frequency is substantially in proportion to the off leakage current of the PMOS transistor QP21. Since the off leakage current depends on the exponential of the inverse of the temperature (exp(−1/T)), a ring oscillator having a large temperature dependency similar to that of the wear-out failure factor, can be realized.

As shown in FIG. 16A, by inputting the node N21 not to the ordinary logic circuit but to the comparator CMP, more stable oscillation operation can be obtained. In other words, since a change of the node N21 from a low level to a high level is gradual, when being received by the logic circuit, it propagates without full swing of the signal and eventually could stay around the logical threshold value without full oscillations. Since the output of the comparator CMP changes greatly from a low level to a high level around the input threshold value, a ring oscillator that stably oscillates with a full oscillation can be obtained. A feed back element ANF against noise is inserted between the output and the input of the inverter IV22. The feed back element ANF against noise is an inverter formed by the PMOS transistors QP22 and QP23 and the NMOS transistors QN25 and QN26.

Figure 16B:
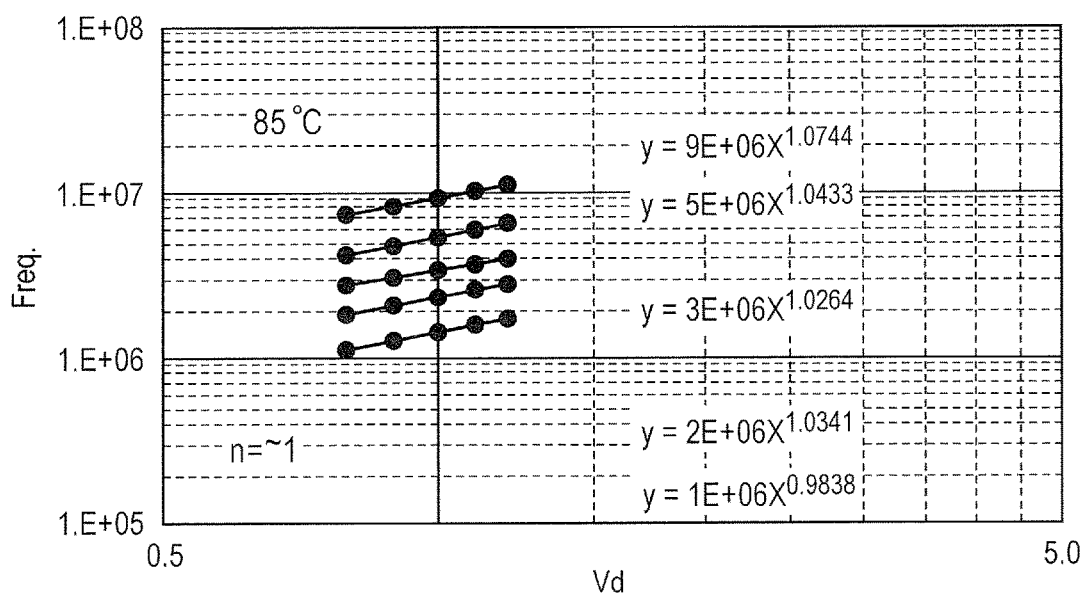
FIG. 16B is a view showing the voltage dependency of the oscillation frequency of the ring oscillator in FIG. 16A.
Figure 16C:
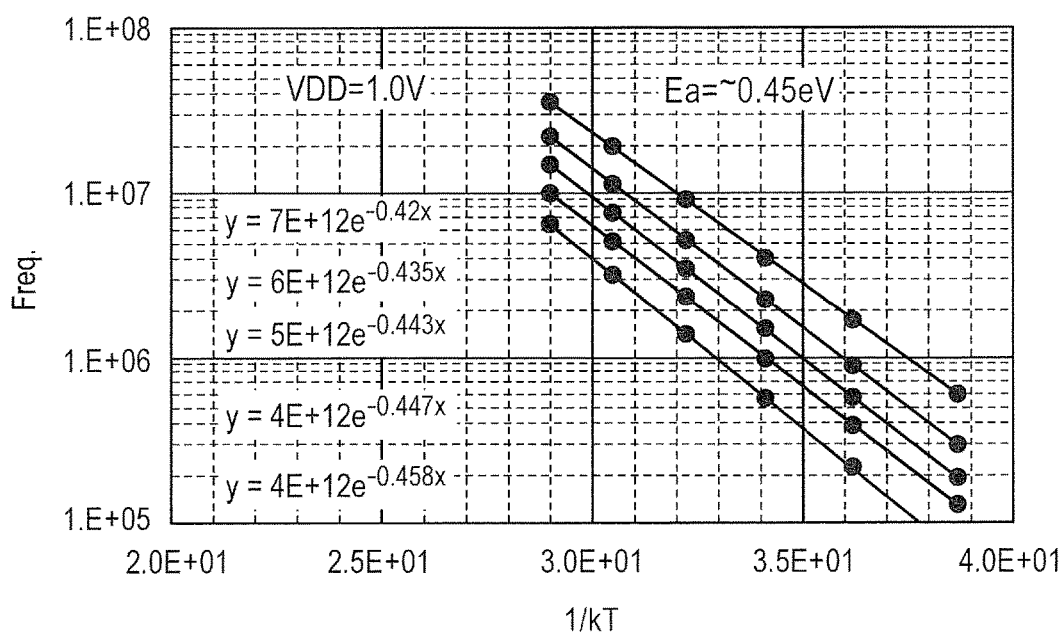
FIG. 16C is a view showing the temperature dependency of the oscillation frequency of the ring oscillator in FIG. 16A.

FIG. 16B is a view showing the voltage dependency of the oscillation frequency of the ring oscillator in FIG. 16A. FIG. 16C is a view showing the temperature dependency of the oscillation frequency of the ring oscillator in FIG. 16A. The oscillation frequency of the ring oscillator 11B is almost proportional to the voltage (Freq∝V) and the voltage dependency is very small in the logarithm expression. It has the exponential dependency (Freq∝exp(−Ea/kT)) of around Ea=0.45 eV as for the temperature. For example, when the wear-out failure factor has the temperature exponential dependency of around Ea=0.9 eV, it corresponds to a ring oscillator with p=2. In other words, when the oscillation frequency is squared, a value in proportion to the degradation stress amount can be obtained. For example, according to the p-th power calculating circuit 122 described later, the square of the oscillation frequency can be obtained easily.

Figure 17A:
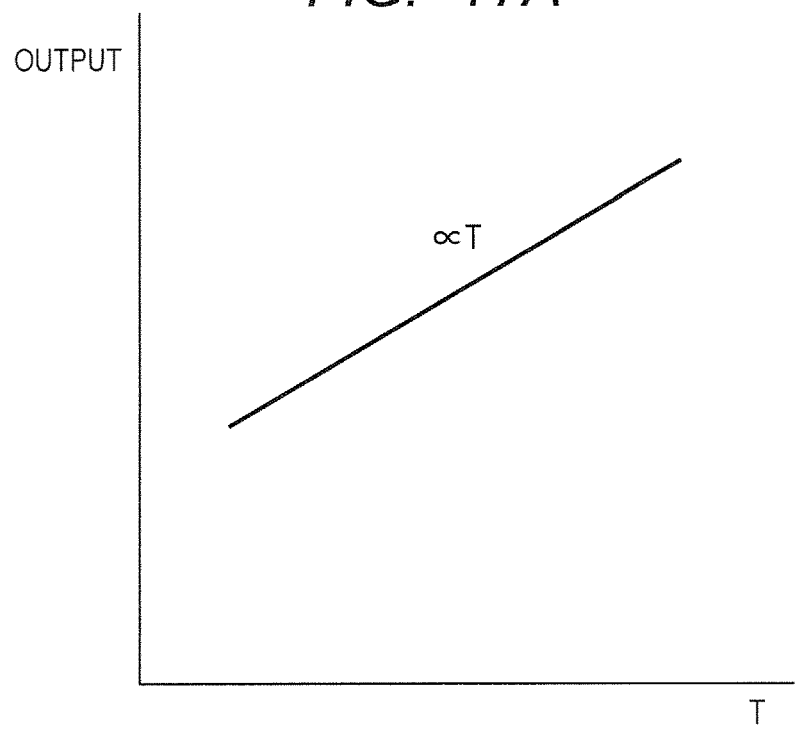
FIG. 17A is a view showing the temperature characteristic of the general temperature sensor.
Figure 17B:
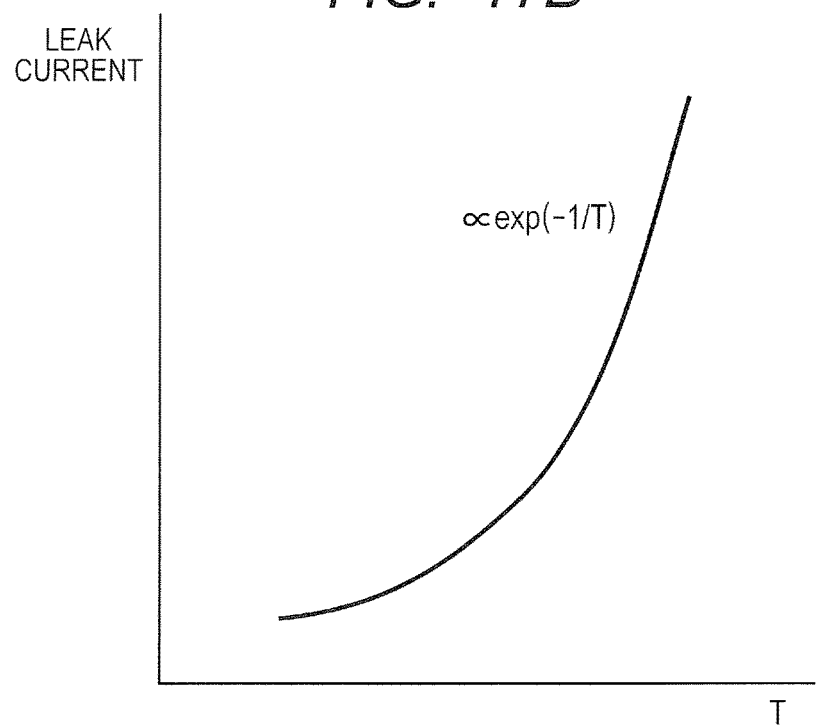
FIG. 17B is a view showing the temperature characteristic of a leakage current.

FIG. 17A is a view showing the temperature characteristic of a normal temperature sensor. FIG. 17B is a view showing the temperature characteristic of a leakage current.

The reason why the ring oscillator using the leakage current is more suitable for monitoring the cumulative degradation stress amount than that using the normal temperature sensor, is as follows. As shown in FIG. 17A, since the temperature sensor aims to recognize temperature accurately, an output value linear to the temperature is preferable. On the other hand, the wear-out failure factor depends on the exponential of the inverse of the temperature, as shown in the expressions (1) and (2). Therefore, in order to obtain the cumulative degradation stress amount, the CPU needs to operate for the calculation continuously, which always gives an extra burden to the main task. As shown in FIG. 17B, since the leakage current shows the exponential dependency of the inverse of the temperature, similar to that of the wear-out failure factor, it basically corresponds to the cumulative degradation stress amount as it is. In short, according to the ring oscillator using the leakage current, it is possible to obtain a cumulative degradation stress amount in a simple structure. A circuit using the leakage current having the exponential dependency of the inverse of the temperature is more suitable to obtain the index of the degradation having the similar exponential temperature dependency than the temperature sensor preferably having the linear characteristic for the temperature.

(Cumulative-stress-amount Holding Circuit)

Figure 18:
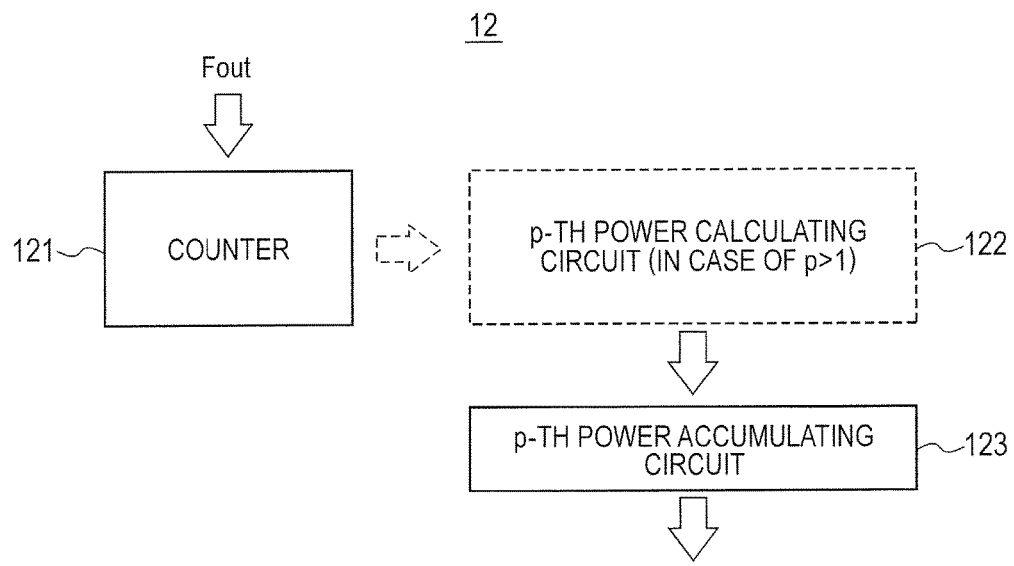
FIG. 18 is a block diagram showing one example of a cumulative-stress-amount holding circuit in FIG. 1.

FIG. 18 is a block diagram showing one example of the cumulative-stress-amount holding circuit in FIG. 1. The cumulative-stress-amount holding circuit 12 includes a counter 121, a p-th power calculating circuit 122, and a p-th power accumulating circuit 123. The counter 121 counts the toggle of the output (Fout) of the ring oscillator 11 or the output from a divider for dividing the Fout. The p-th power calculating circuit 122 is used in the case of p>1 and not used in the case of p=1. The p-th power accumulating circuit 123 accumulates the output of the p-th power calculating circuit 122 in the case of p>1 and accumulates the output of the counter 121 in the case of p=1. The details of the counter 121, the p-th power calculating circuit 122, and the p-th power accumulating circuit 123 will be described later.

Figure 19:
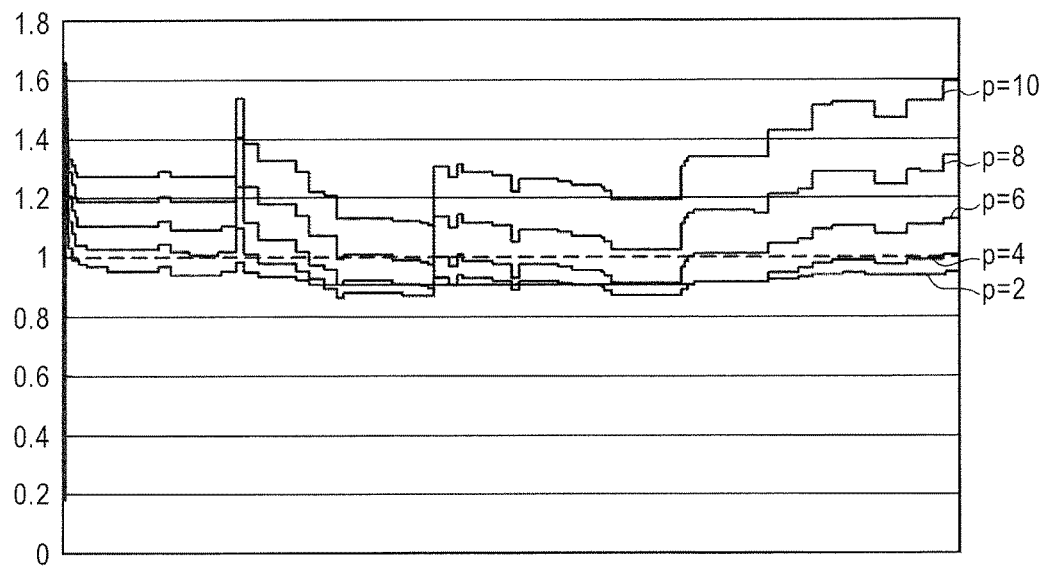
FIG. 19 is a view showing the accuracy of the p-th power approximation.
Figure 21:
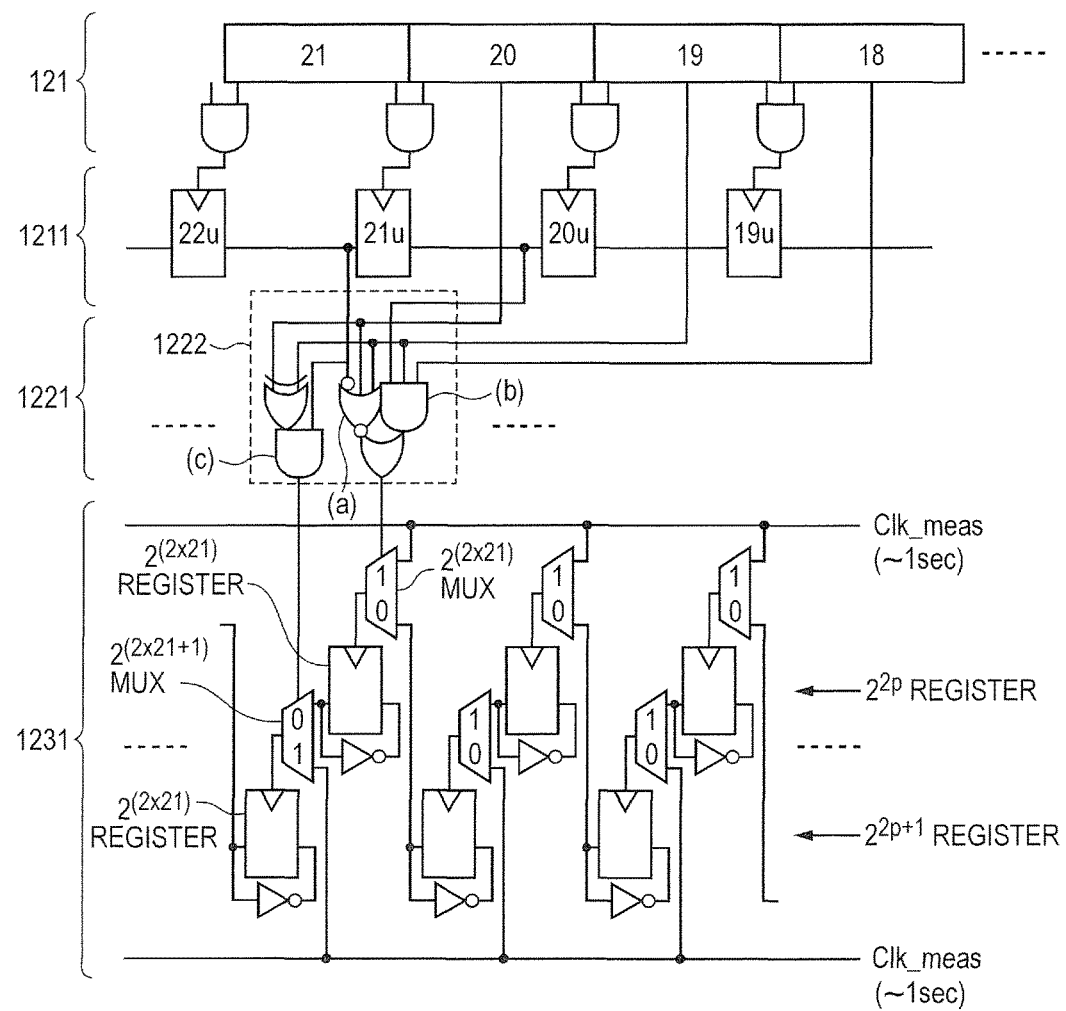
FIG. 21 is a block diagram showing an example of a square approximation calculating circuit and a square value accumulating counter.

FIG. 19 is a view showing the accuracy of the p-th power approximation. If the ring oscillator is that one capable of expressing the voltage and temperature dependency of the wear-out failure by a square or fourth power of the oscillation frequency, the cumulative stress count by approximating the p-th power in a simple logic can be obtained, as shown in FIG. 21. The horizontal axis in FIG. 19 indicates the number of the times of accumulating the p-th power stress count obtained periodically. The vertical axis indicates the relative value of the p-th power approximation when the accurate p-th power is defined as 1. The accuracy of the approximation calculation is higher as it is closer to 1. In p=2, and 4, with an increase in the cumulative number, the vertical axis goes to almost 1, which indicates a higher accuracy of the approximation calculation. In p=6, 8, and 10, an error is getting larger and the convergence is deteriorated in the accumulation. At least, the p should be a natural number of single digit; otherwise, the error of the approximation exceeds 20%, deteriorating the convergence. Preferably, it should be 4 and less.

Hereinafter, the p-th power approximation calculation method will be described.

$$\text{Square value} = \{A[p]*2^p + A[p-1]*2^{(p-1)} + A[p-2]*2^{(p-2)}\dots\}^2 \quad (9).$$

Three 0/1 values in the decreasing direction of the digit from the most significant bit $2^p$ of binary are defined as $A[p]$, $A[p-1]$, and $A[p-2]$. Evidently, $A[p]=1$. The square approximation is as follows.

(i) When $(A[p-1], A[p-2]) = (1,1)$, the square
value $\sim 2^{(2p+2)}$            (10).

(ii) When $(A[p-1], A[p-2]) = (1,0)$ or $(0,1)$, the square
value $\sim 2^{(2p+1)}$            (11).

(iii) When $(A[p-1], A[p-2]) = (0,0)$, the square
value $\sim 2^{(2p)}$            (12).

The above square approximation is expressed as the binary having only one "1" in its digits.

The fourth power approximation, sixth power approximation, eighth power approximation, and tenth power approximation are obtained by raising the square approximation having only one "1" in its binary digits to the second, third, fourth, and fifth power respectively. An error (ratio to a precise value) of the N-th power cumulative amount is evaluated by creating randomly binary number of 15 to 30 digits; the result shows that the errors as for the square and the fourth power are small (the ratio is close to 1). (FIG. 19)

In the case of the ring oscillator of p=4, the fourth power of the oscillation frequency is approximated as a value obtained by further squaring the square approximation having only one "1" in its most significant bit according to the classification of the above (i) to (iii) and this is accumulated, hence to obtain the cumulative stress count easily with high accuracy. More specifically, for example, the oscillation count is obtained in every second (corresponding to the definition of frequency), converted into the fourth power approximation having only one "1" in its most significant bit in the above p-th power approximation calculation, and added cumulatively. When the interval is T0 second other than 1 second, the frequency is a value of 1/T0 times and the p-th power is a value of $(1/T0)^p$ times; therefore, the relative value of the cumulative degradation stress amount depending on the voltage and temperature does not change even in the case of another interval other than 1 second. In short, the cumulative degradation stress can be accurately evaluated. The T0 is preferably set at a long interval as long as it keeps the sensitivity of a temporal change in the voltage and the temperature, and a short interval as far as it avoids the overhead for obtaining the count frequently.

Figure 20:
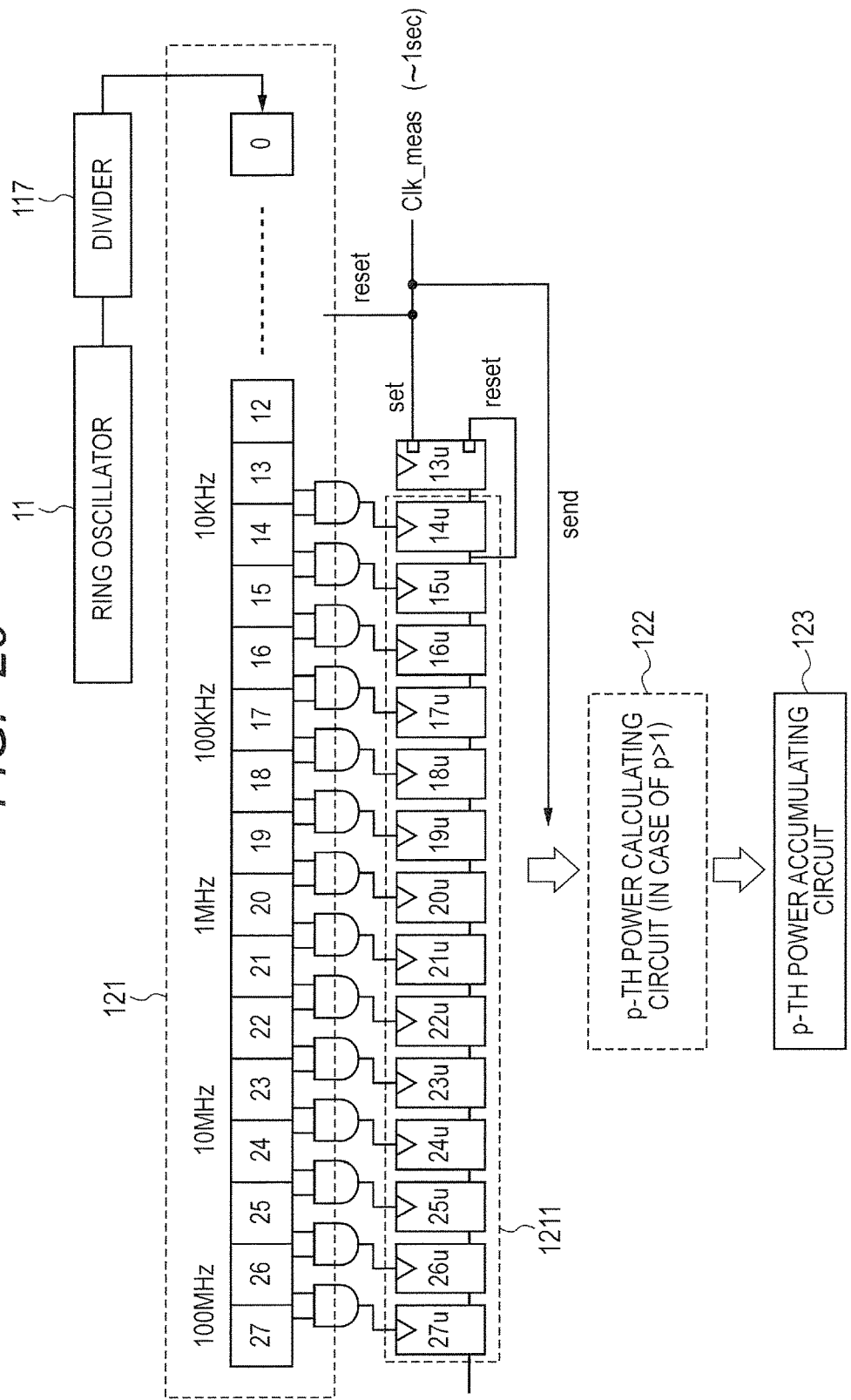
FIG. 20 is a block diagram showing an example of a counter.

FIG. 20 is a block diagram showing one structure of the counter in FIG. 18. In FIG. 20, a divider 117 is provided between the ring oscillator 11 and the counter 121 in order to decrease the frequency; however, this is not always necessary. When the characteristic of the ring oscillator is p>1, the value of the counter 121 is sent to the p-th power calculating circuit 122 in every T0 second (here, one second), in synchronization with the rising of a clock (Clk_meas), and at the same time, the counter 121 is reset (reset). The Clk_meas is created by a timer counter not illustrated. When p=1, the value of the counter 121 is directly sent to the p-th power accumulating circuit 123. In FIG. 20, a register 1211 with 1 only in the most significant bit is further provided for easy calculation. When p=1, instead of the counter value, the value of the register 1211 may be added in the p-th power accumulating circuit 123.

The register 1211 operates as follows. At the rising edge of the Clk_meas, a register 13*u* positioned at the right most is set at 1 (set). When the 13th of the counter 121 is in a state of 1 and the 14th is first turned into 1, the input clock of the flip-flop 14*u* second from the right rises up and 1 of the rightmost register is transferred. Then, the rightmost register is reset to 0. Then, the flip-flop 15*u* third from the right is eventually turned into 1 in the following sequence; where the transition is expressed as "(15th, 14th, and 13th) of the counter 121"⇒ "clock of the register 1211 (clock of the flip-flop 15*u*, clock of the flip-flop 14*u*)" "data of the register 1211 (data of the flip-flop 15*u*, data of the flip-flop 14*u*, data of the flip-flop 13*u*)":

(0, 1, 0)⇒(0, 0)⇒(0, 0, 1)
(0, 1, 1)⇒(0, 1)⇒(0, 0→1, 1→0)
(1, 0, 0)⇒(0, 0)⇒(0, 1, 0)
(1, 1, 1)⇒(1, 1)⇒(0→1, 1→0, 0).

Thus, the data 1 of the flip-flop 14*u* is moved to the flip-flop 15*u* and the flip-flop 14*u* becomes 0. The shift of 1 to the flip-flops 16*u*, 17*u*, . . . is the same. In short, only the register corresponding to most significant bit of the counter becomes 1. When p=1, without using the Clk_meas, the counter 121 may be continuously used to count up during the whole product usage period, as a simple structure. In this case, the number of the digits of the counter 121 and the divider 117 are optimized to avoid an overflow of the counter 121.

FIG. 21 is a block diagram showing the schematic example of the square approximation calculating circuit and the square value accumulating counter. The square approximation calculating circuit 1221 is one example of the p-th power calculating circuit 122. The square value accumulating counter 1231 is provided in the always power-on area, thereby working as the p-th power accumulating circuit 123. Even when it is provided in the area that is not always power-on, a non-volatile memory circuit is added, thereby working as the p-th power accumulating circuit 123. Even if the power is shut off, the cumulative result should not be lost.

According to the above mentioned p-th power approximation calculation, a number 1 is added to, for example, the $2^{\wedge}(2\times21)$ register, either (a) when the most significant bit is "21" and ("20", "19")=(0, 0), or (b) when the most significant bit is "20" and ("19", "18")=(1, 1). The number 1 is added to the (2×21+1) register, (c) when the most significant bit is "21" and ("20", "19")=(0, 1) or (1, 0).

A logic circuit 1222 corresponding to (a)~(c) is shown in the square approximation calculating circuit 1221 in FIG. 21. The above (a) is NOR (inverted logical sum) receiving the inverted signal of the output of the flip-flop 21u and the 20th and the 19th of the counter 121. The above (b) is AND (logical product) receiving the output of the flip-flop 20u and the 19th and 18th of the counter 121. The above (c) is XOR (exclusive OR) receiving the 20th and the 19th of the counter 121 and AND receiving the output of this XOR and the output of the flip-flop 21u. The logic circuit 1222 includes OR (logical sum) receiving the output of the NOR of the (a) and the output of the AND of the (b), as well as the NOR of the (a), the AND of the (b), and the AND and XOR of the (c). When these outputs of the logic circuit 1222 are 0, the MUX (multiplexer) of the square value accumulating counter 1231 selects a path denoted as "0". When these outputs of the logic circuit 1222 are 1, the MUX of the square value accumulating counter 1231 selects a path denoted as "1". As the result, when the input to the $2^{\wedge}(2\times21)$ MUX from the square calculating circuit 1222 is 1, in other words, when 1 is added to the $2^{\wedge}(2\times21)$ register, CLK_meas is coupled to the clock terminal of the $2^{\wedge}(2\times21)$ register. Other registers of the square value accumulating counter 1231 are connected in the same way as the counter (the output of a register in the former stage is coupled to the clock terminal of the next register). As the result, $2^{\wedge}(2\times21)$ is added to the square value accumulating counter 1231. This is the same also in the case of adding $2^{\wedge}(2\times21+1)$ to the square value accumulating counter. The above is the operation of the square approximation calculating circuit and the square value accumulating counter in FIG. 21. In the case of the fourth power approximation calculating circuit and the fourth power accumulating counter, the $2^{\wedge}(2\times N)$ register can be replaced with $2^{\wedge}(4\times N)$ register and the $2^{\wedge}(2\times N+1)$ register can be replaced with $2^{\wedge}(4\times N+2)$ register.

According to the p-th power accumulating circuit in the embodiment, by using a ring oscillator in which the square or the fourth power of the oscillation frequency is substantially equal to the voltage and temperature dependency of the stress amount (inverse of the lifetime) of the wear-out failure factor, the cumulative degradation stress amount of the mounted semiconductor device can be obtained easily with high accuracy, thereby a reliable and secure semiconductor device is achieved.

(Criteria)

Figure 22:
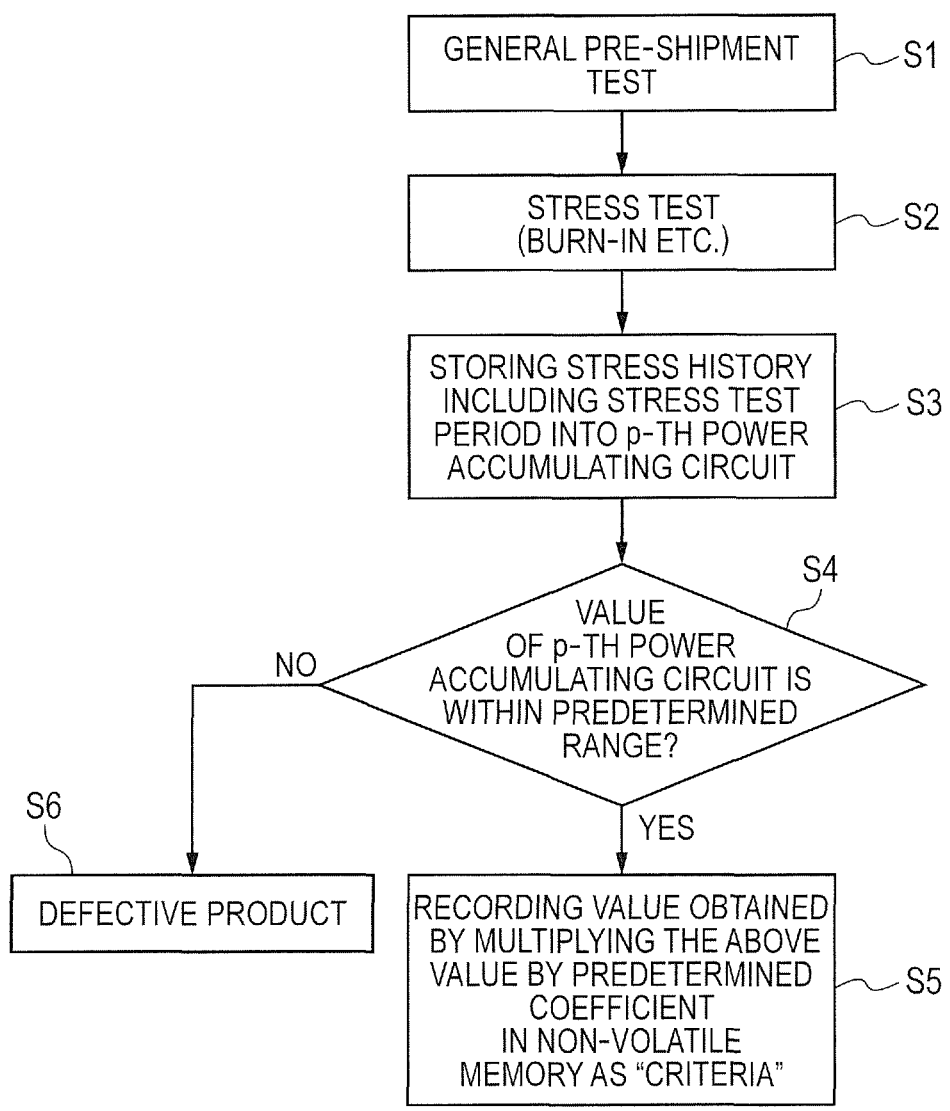
FIG. 22 is a flow chart showing a method of setting criteria.

FIG. 22 is a flow chart showing an example of a method of setting a reference value before shipment for determining the criteria (dangerous level of the cumulative stress amount) of FIG. 1. The criteria may be set at a predetermined value previously, according to the cumulative stress amount which increases a possibility of causing a fault in a semiconductor chip to a predetermined level. In the ring oscillator 11 of the cumulative degradation stress detection circuit 10, however, frequency at a predetermined voltage and temperature fluctuates to some degree, depending on the fluctuating manufacturing process condition of the semiconductor chip. In order to calibrate this fluctuation amount, and enhance a fault prediction accuracy, the criteria is set based on the cumulative stress amount measured in a pre-shipment stress test.

In other words, another stress test (for example, burn-in test at high temperature and high voltage) in addition to the general pre-shipment test (Step S1) is performed (Step S2). Here, by operating the ring oscillator 11, the count value corresponding to the stress history is obtained and stored within the p-th power accumulating circuit 123 according to the above mentioned method (Step S3). It is determined whether this count value is within a predetermined range satisfying the quality of the semiconductor chip manufacturing process (Step S4). When it is not within the predetermined range, it is considered that some defect exists somewhere in the circuit including the ring oscillator 11 and this is determined as a defective product (Step S5). When it is within the predetermined range, a value obtained by multiplying this count value by a predetermined coefficient is recorded in the non-volatile memory as "criteria" (Step S6). The predetermined coefficient is a ratio of the dangerous stress level to the stress test in terms of the cumulative stress amount.

According to the criteria setting method of the embodiment, the criteria can be properly set depending on the frequency fluctuation of the ring oscillator caused by the fluctuation in the process condition, hence to predict a fault at high accuracy. Here, multiple criteria may be set depending on the degree of a risk of a fault.

Application Example 1

Figure 23:
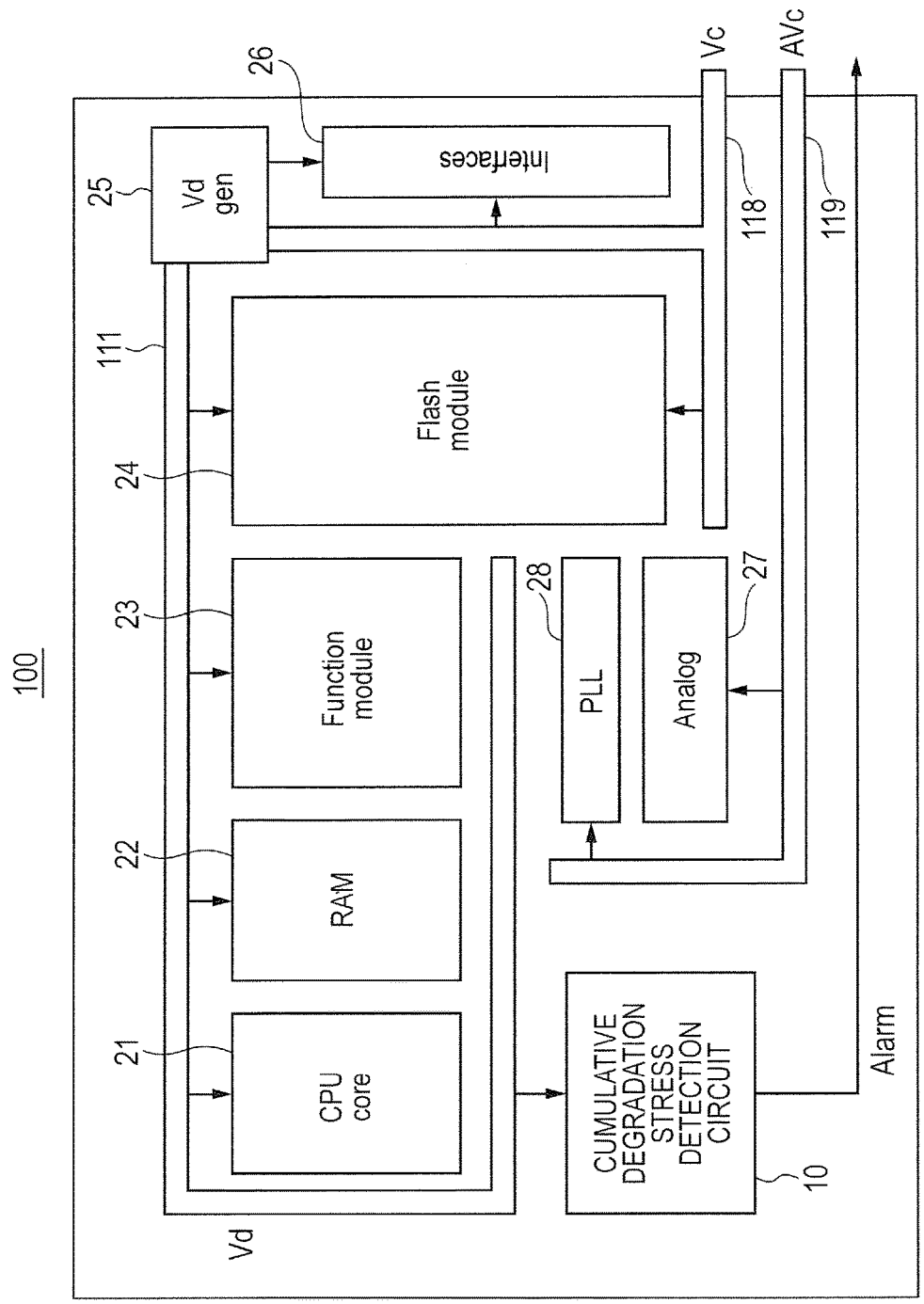
FIG. 23 is a block diagram showing the structure of a micro-controller according to an application example 1.

FIG. 23 shows a schematic example of a micro-computer having the cumulative degradation stress detection circuit in FIG. 1. The micro-controller 100 as a semiconductor device includes a CPU core (core) 21, a RAM 22, a function module 23, and a flash module 24, at least a part of which is operated with the power supply potential (Vd), on one semiconductor chip. The Vd is shared with the cumulative degradation stress detection circuit 10. The degradation stress amount of the wear-out failure depending on the voltage and the temperature, in a module operated with the power supply potential (Vd) is cumulatively recorded in the p-th power accumulating circuit 123 within the cumulative degradation stress detection circuit 10, and therefore, the cumulative degradation stress amount of the module can be grasped, thereby a reliable and secure semiconductor device and a system predicting a fault and preparing for it in advance can be obtained. Here is shown the case of creating an internal operation power supply potential (Vd) from the external power supply potential (Vc) by a voltage regulator (Vd gen) 25. Further, the micro-controller 100 includes an interface circuit (Interface) 26 which is operated with the power supply potential (Vd) and the external power supply potential (Vc), an analog circuit (Analog) 27 which is operated with the external power supply potential (AVc), and a PLL 28 which generates a clock.

Application Example 2

Figure 24:
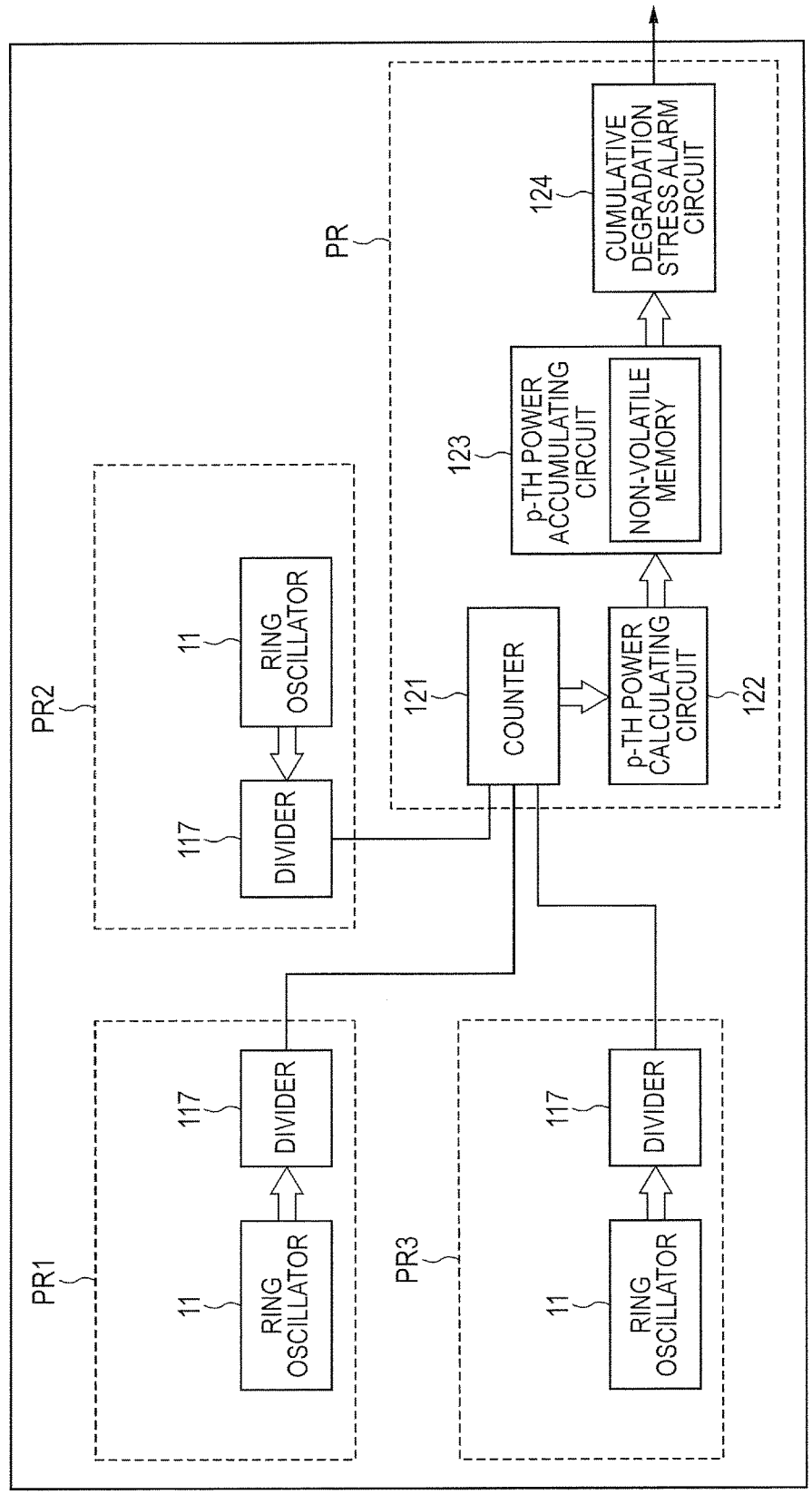
FIG. 24 is a block diagram showing a semiconductor device according to an application example 2.

FIG. 24 shows one example of the ring oscillators arranged in multiple power supply domains. The supplied power voltage can be shut off by a power switch in each power sully domain, to reduce unnecessary leakage current in a region not used. On one semiconductor chip, a semiconductor device 101 includes a region PR in always power-on state and power regions PR1, PR2, and PR3 which can be turned off by the power switch provided on the semiconductor chip. The outputs from the ring oscillators 11 provided in the respective power regions PR1, PR2, and PR3 are reduced in frequency by the respective dividers 117 and then sent to the counter 121 provided in the always power-on region PR. The counter 121 holds the count values of the respective ring oscillators 11. The p-th power calculating circuit 122 and the p-th power accumulating circuit 123 (=cumulative degradation stress counter 1232) are also provided in the always power-on region PR. The p-th power accumulating circuit 123 is provided with a non-volatile memory circuit, so as not to lose the p-th power value accumulated even when the power of the whole semiconductor device 101 is shut off. A cumulative degradation stress alarm circuit 124 is provided with the criteria holding circuit 13 and the alarm generating circuit 14, in the always power-on region PR; however, they are not restricted to this particularly. According to a control of the CPU provided in some of the power regions PR1, PR2, and PR3, the CPU may examine the count value of the cumulative degradation stress counter 1232 and issue an alarm of the cumulative deterioration stress when the CPU is in the power-on period.

According to the application example, voltage stress in each power domain can be separately monitored with ease, thereby a reliable and secure semiconductor device is achieved.

Application Example 3

Figure 25:
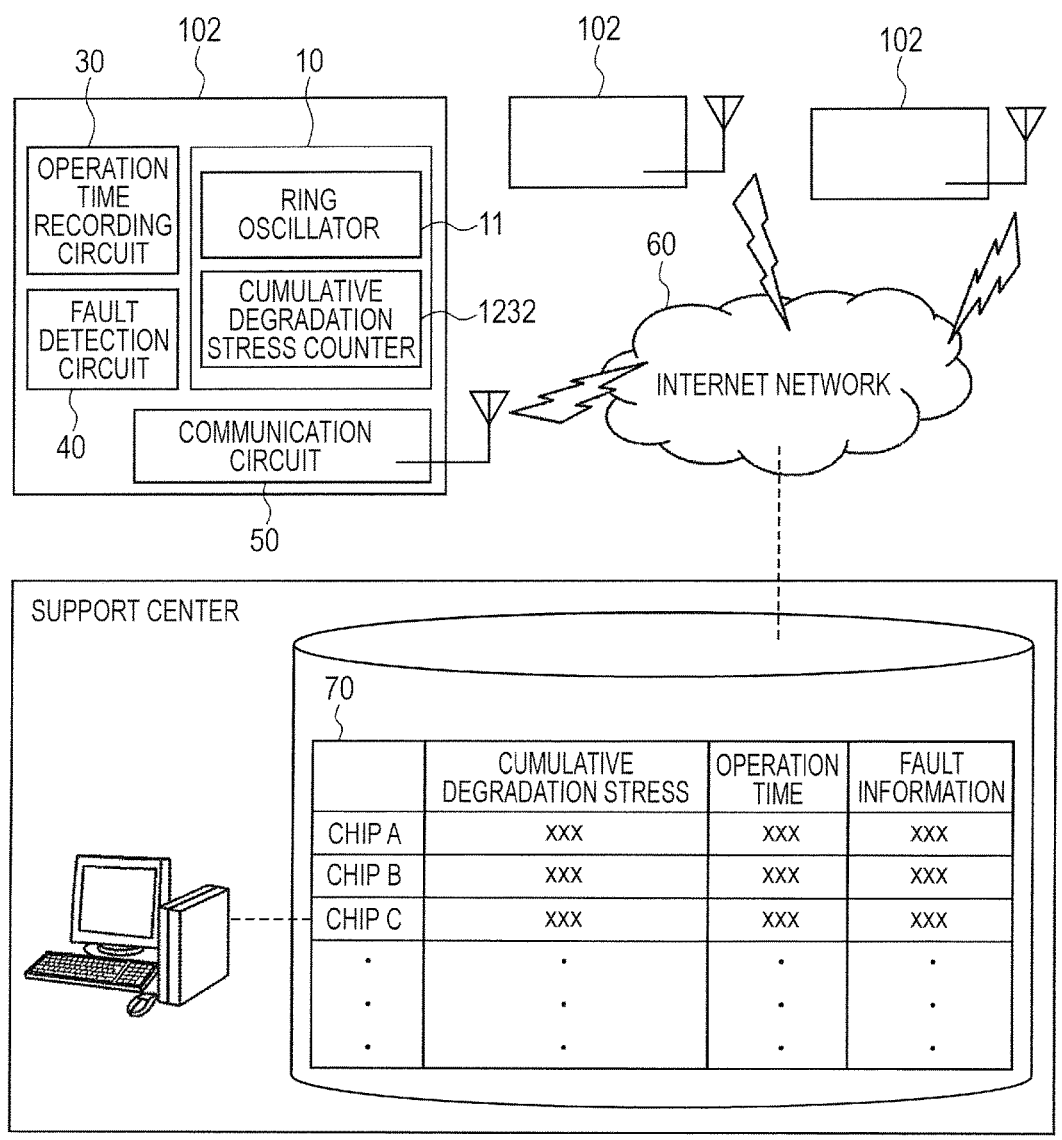
FIG. 25 is a block diagram showing a system according to an application example 3.

In FIG. 25, a semiconductor device (semiconductor chip) 102 further includes an operation time recording circuit 30, a fault detection circuit 40, and a communication circuit 50, in addition to the cumulative degradation stress detection circuit 10. The count value (cumulative degradation stress) of the cumulative degradation stress counter 1232 operating on the same product type is collected to a database 70 through the Internet (network (internet)) 60.

A person in charge of maintenance can determine that, for example, there is a risk of causing a fault soon according to the information about the count value of the cumulative degradation stress counter 1232 and can cope with the above by replacing the corresponding semiconductor chip before the fault, hence to obtain a reliable and secure system. Compared with the case of the semiconductor chip itself determining a risk of a fault and issuing an alarm, a person in charge of the maintenance can know the count value itself, which increases an amount of information to judge effectively. The other data including operation time and fault information may be collected. With respect to the operation time, a function of obtaining the above information (operation time recording circuit 30) may be provided in the semiconductor chip itself or the date when a semiconductor chip is mounted on a system in a market may be recorded separately in a database. The fault information can be obtained by providing the fault detection circuit 40 in the semiconductor chip itself.

The semiconductor device according to the examples and the application examples can be applied to a system requiring a high reliability, for example, a semiconductor device for use in a vehicle, or a semiconductor device for use in a wireless network sensor system on the Internet of Things (IoT) requiring a persistent normal operation.

As mentioned above, although the invention made by the inventor et al. has been concretely described based on the examples, comparison examples, and application examples, it is needless to say that the invention is not restricted to the above embodiments, examples, comparison examples, and application examples, but various modifications can be made.

For example, although one ring oscillator is used in the application examples, the ring oscillators including both the ring oscillator 11A (for example, the ring oscillator 11A6) and the ring oscillator 11B may be used. According to this, it is possible to detect both a wear-out failure caused by the gate-TDDB and NBTI wear-out failure factor and a wear-out failure caused by the electromigration and the stress migration wear-out factor.

The example with the non-volatile memory circuit provided in the p-th power accumulating circuit 123 has been described and the application example 1 using the p-th power accumulating circuit 123 has been described. Therein the contents of the p-th power accumulating circuit 123 may be written and saved in the flash module 24 before shutting off the p-th power accumulating circuit 123 and the saved contents may be returned to the p-th power accumulating circuit 123 after turning on the power. Further, the criteria may be stored in the flash module 24. On behalf of the alarm generating circuit 14, the CPU 21 may compare the contents of the p-th power accumulating circuit 123 or the contents saved in the flash module 24, to the criteria and generate an alarm.

What is claimed is:

1. A semiconductor device, comprising:
   a ring oscillator including a plurality of stages of controlled-current driven inverters;
   a cumulative-stress-amount holding circuit that holds a cumulative degradation stress count value obtained from an output of the ring oscillator; and
   a control circuit including a first voltage generating circuit that controls a current of the controlled-current,
   wherein the control circuit controls the controlled-current to emphasize temperature dependency of an oscillation frequency of the ring oscillator, and
   wherein the cumulative-stress-amount holding circuit periodically obtains p-th power of the oscillation frequency of the ring oscillator and accumulates the p-th power of the oscillation frequency of the ring oscillator.

2. A semiconductor device according to claim 1, wherein the control circuit controls the controlled-current to further emphasize voltage dependency of the oscillation frequency of the ring oscillator.

3. The device according to claim 2, wherein the control circuit controls so that the oscillation frequency of the ring oscillator depends on a power of a power supply voltage and an exponential of an inverse of a temperature.

4. The device according to claim 2, wherein the first voltage generating circuit includes a first output line of outputting a first voltage between the power supply voltage supplied to a power supply line and a reference voltage supplied to a reference line, and
   a second output line of outputting a second voltage between the power supply voltage and the reference voltage, and
   wherein each of the plural stages of the inverters includes
   a controlled-current PMOS transistor with a source thereof coupled to the power supply line and a gate thereof coupled to the second output line, and
   a controlled-current NMOS transistor with a source thereof coupled to the reference line and a gate thereof coupled to the first output line.

5. The device according to claim 4, wherein in a normal operation voltage, the first voltage is a voltage less than ½ of the power supply voltage, and the second voltage is a voltage more than ½ of the power supply voltage.

6. The device according to claim 4, wherein the oscillation frequency of the ring oscillator has a dependency close to a power of the power supply voltage and a dependency close to an exponential of an inverse of a temperature.

7. The device according to claim 4, wherein the first voltage generating circuit includes a first PMOS transistor coupled between the power supply line and the first output line, and a first NMOS transistor coupled between the reference line and the second output line.

8. The device according to claim 7, wherein the control circuit further includes a second voltage generating circuit that controls the first voltage generating circuit, wherein the second voltage generating circuit includes a third output line of outputting a third voltage between the power supply voltage supplied to the power supply line and the reference voltage supplied to the reference line, and a fourth output line of outputting a fourth voltage between the power supply voltage and the reference voltage, wherein the third output line and the fourth output line are coupled to the first voltage generating circuit.

9. The device according to claim 8, wherein the third voltage is higher than the fourth voltage, wherein the third voltage has a positive temperature dependency, and wherein the fourth voltage has a negative temperature dependency.

10. A semiconductor device comprising a ring oscillator, and a cumulative-stress-amount holding circuit that holds a cumulative degradation stress count value obtained from consecutive accumulation of an oscillation output of the ring oscillator, wherein an oscillation frequency of the ring oscillator is set to be emphasized by not a voltage dependency but a temperature dependency, and wherein the oscillation frequency of the ring oscillator is substantially in proportion to leakage current.

11. A semiconductor device according to claim 10, wherein the cumulative-stress-amount holding circuit periodically obtains p-th power of the oscillation frequency of the ring oscillator and accumulates the p-th power of the oscillation frequency of the ring oscillator.

12. The device according to claim 11, wherein the oscillation frequency of the ring oscillator depends on an exponential of an inverse of a temperature.

13. The device according to claim 11, wherein the ring oscillator forms a loop by a plurality of stages of delay inverters and a delay circuit, wherein the delay circuit includes a leakage type pull-up element coupled to the plurality of stages of delay inverters, and wherein a time when the output of the leakage type pull-up element changes from a low level to a high level is larger than a delay time of the plurality of stages of delay inverters.

14. The device according to claim 13, wherein the leakage type pull-up element comprises a PMOS transistor and the oscillation frequency of the ring oscillator has an exponential dependence on an inverse of a temperature.

15. A semiconductor device, comprising:

a ring oscillator; and a cumulative-stress-amount holding circuit that holds a cumulative degradation stress count value obtained from an output of the ring oscillator, wherein the cumulative degradation stress count value is used to generate a cumulative degradation stress alarm by comparing with a count value of criteria, and wherein the cumulative-stress-amount holding circuit periodically obtains p-th power of the oscillation frequency of the ring oscillator and accumulates the p-th power of the oscillation frequency of the ring oscillator.

16. The device according to claim 15, wherein the cumulative-stress-amount holding circuit includes a counter that counts the output oscillation of the ring oscillator or an output obtained by dividing the output frequency of the ring oscillator, a p-th power calculating circuit that calculates a p-th power of the counter value, and a p-th power accumulating circuit that accumulates the calculation result of the p-th power calculating circuit.

17. The device according to claim 16, wherein the p-th power accumulating circuit includes a non-volatile recording circuit.

18. The device according to claim 16, wherein the p-th power accumulating circuit is arranged in an area where power is not shut off.

19. The device according to claim 15, wherein the ring oscillator includes a plurality of stages of controlled-current driven inverters, and a voltage generating circuit which controls a current of the controlled-current, wherein the oscillation frequency of the ring oscillator has a dependency close to a power of the power supply voltage and a dependency close to an exponential of an inverse of temperature.

20. The device according to claim 15, wherein the ring oscillator includes plural stages of inverters that form a loop, and a delay circuit that delays the loop of the plural stages of the inverters, wherein the oscillation frequency of the ring oscillator has a dependency close to an exponential of an inverse of a temperature.

* * * * *